United States Patent
Shinohara

(10) Patent No.: US 8,462,249 B2
(45) Date of Patent: Jun. 11, 2013

(54) SOLID-STATE IMAGING DEVICE, METHOD OF MANUFACTURING THE SAME, AND ELECTRONIC APPARATUS

(75) Inventor: Takekazu Shinohara, Tokyo (JP)

(73) Assignee: Sony Corporation (JP)

( * ) Notice: Subject to any disclaimer, the term of this patent is extended or adjusted under 35 U.S.C. 154(b) by 285 days.

(21) Appl. No.: 13/011,453

(22) Filed: Jan. 21, 2011

(65) Prior Publication Data

US 2011/0187911 A1 Aug. 4, 2011

(30) Foreign Application Priority Data

Jan. 29, 2010 (JP) ................... 2010-019597

(51) Int. Cl.
*H04N 5/335* (2006.01)
*H01L 21/70* (2006.01)
*H01L 29/66* (2006.01)

(52) U.S. Cl.
USPC ............ 348/308; 257/244; 257/292; 257/330

(58) Field of Classification Search
USPC .................. 348/294, 302, 308–310; 257/213, 257/215, 242, 244, 290–292, 327, 329, 330
See application file for complete search history.

(56) References Cited

U.S. PATENT DOCUMENTS

| 2005/0167704 A1 | 8/2005 | Ezaki et al. | |
|---|---|---|---|
| 2006/0138489 A1* | 6/2006 | Ahn et al. | 257/292 |
| 2009/0303371 A1* | 12/2009 | Watanabe et al. | 348/311 |
| 2010/0002108 A1* | 1/2010 | Mabuchi | 348/294 |

FOREIGN PATENT DOCUMENTS

JP 2005-223084 8/2005

* cited by examiner

*Primary Examiner* — Sinh Tran
*Assistant Examiner* — Mark Monk
(74) *Attorney, Agent, or Firm* — Sheridan Ross P.C.

(57) ABSTRACT

A solid-state imaging device is provided, which includes a pixel region in which pixels including a photoelectric conversion section and a plurality of pixel transistors are arranged. In the solid-state imaging device, a transfer transistor of the pixel transistors includes: a transfer gate electrode extended in a surface of the substrate formed on the surface of a semiconductor substrate; and a transfer gate electrode buried in the substrate which is electrically insulated from the transfer gate electrode extended in a surface of the substrate and is embedded in the inside of the semiconductor substrate in the vertical direction through the transfer gate electrode extended in a surface of the substrate.

16 Claims, 17 Drawing Sheets

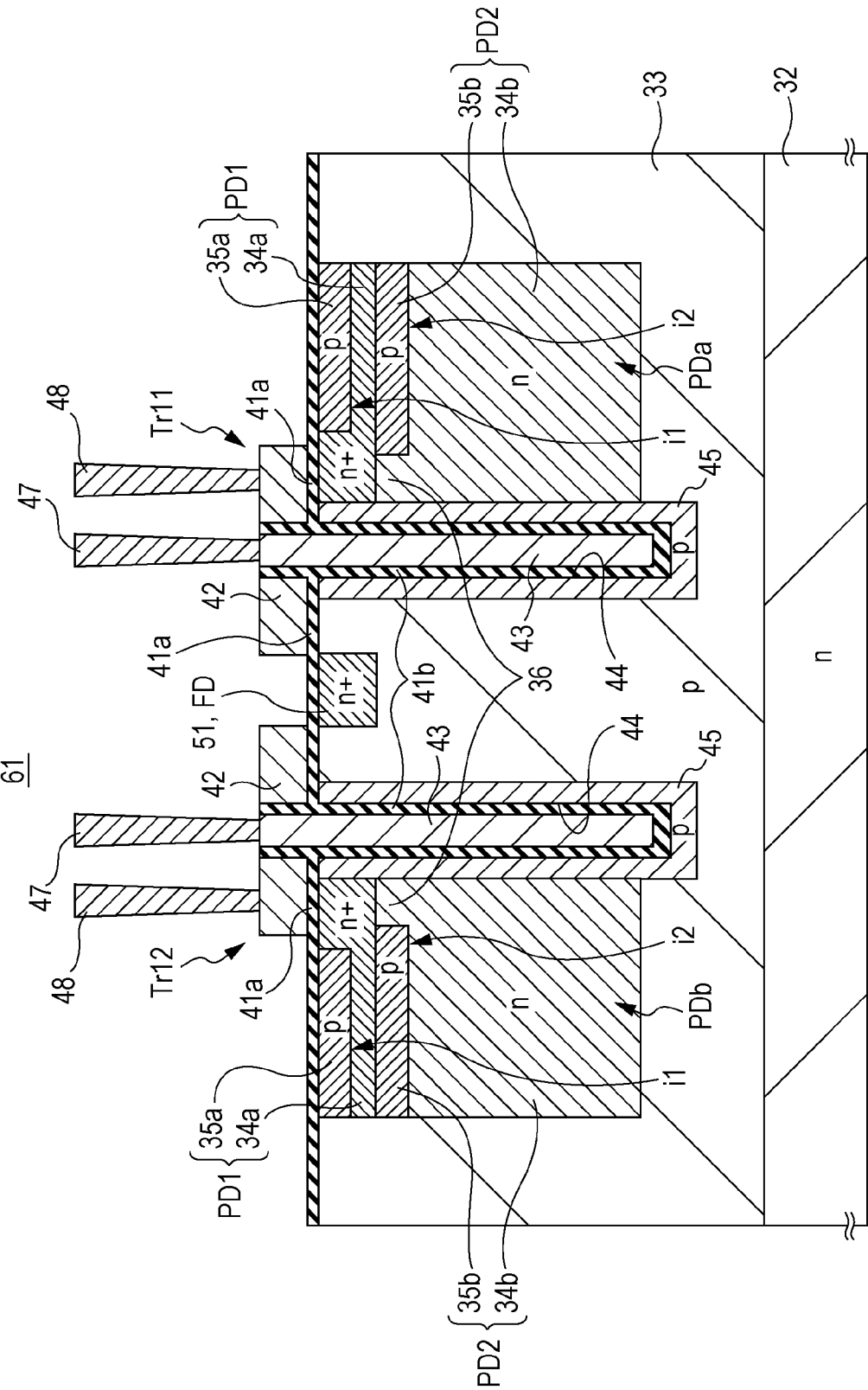

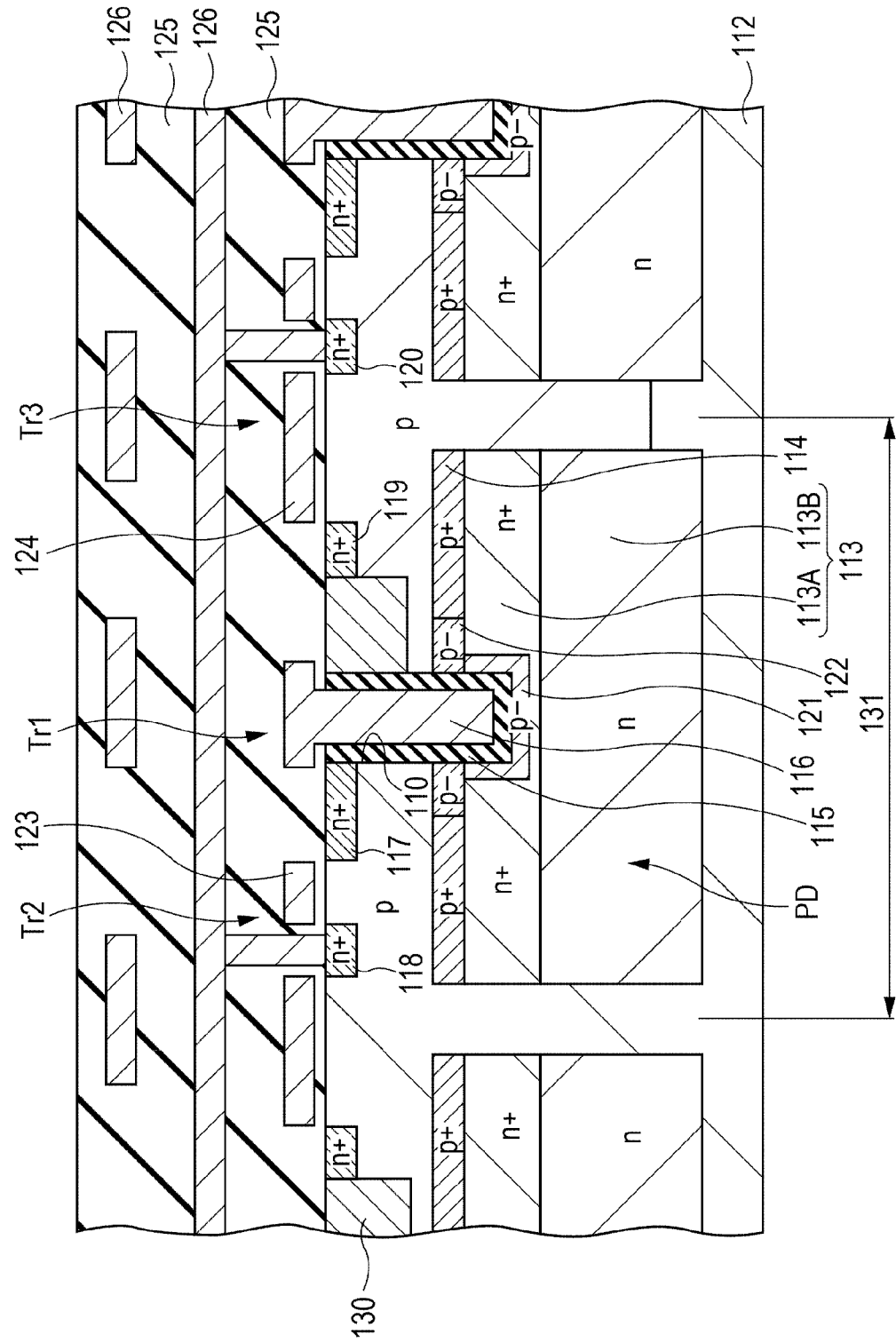

SOLID-STATE IMAGING DEVICE, METHOD OF MANUFACTURING THE SAME, AND ELECTRONIC APPARATUS

BACKGROUND OF THE INVENTION

1. Field of the Invention

The present invention relates to a solid-state imaging device, a method of manufacturing the same, and an electronic apparatus, such as a camera, including the solid-state imaging device.

2. Description of the Related Art

CMOS solid-state imaging devices are known as solid-state imaging devices. This CMOS solid-state imaging device is configured such that one pixel is formed by a photodiode and a plurality of pixel transistors, and a plurality of pixels is two-dimensionally arranged. This photodiode is a photoelectric conversion element that generates and accumulates signal charges in response to the amount of light received, and a plurality of pixel transistors is an element that transfers the signal charges from the photodiode, and reads out the signal charges as a signal. A plurality of pixel transistors can include, for example, four MOS transistors such as a transfer transistor, a reset transistor, an amplification transistor and a selection transistor. Alternatively, a plurality of pixel transistors can include three MOS transistors in which the selection transistor is omitted.

In the CMOS solid-state imaging device, from year to year, miniaturization of a unit pixel proceeds due to demand for increasing numbers of pixels, and thus it is difficult to miniaturize the pixel while holding the imaging characteristics such as the amount of saturated charges (for example, the amount of saturated electrons) Qs. That is, even when the area of the unit pixel is reduced, the area shared to the photodiode by the pixel transistor incapable of being miniaturized due to noise or process limitation lessens and the amount of saturated charges per unit area are not able to be maintained, which results in difficulty in miniaturizing the pixel. Consequently, a p-n junction for forming the photodiode is formed deeper inside of a semiconductor substrate than the pixel transistor and thus the overall area of the unit pixel is occupied by the photodiode. A CMOS solid-state imaging device is proposed in which the amount of saturated charges Qs is secured by this configuration, and charge transfer from the p-n junction deeper than the inside of the semiconductor substrate is realized by forming a vertical transfer transistor, so that miniaturization of the pixel is achieved (see Japanese Unexamined Patent Application Publication No. 2005-223084).

FIG. 22 shows a main cross-section structure of the pixel of such a CMOS solid-state imaging device. A CMOS solid-state imaging device 111 is a backside illumination type solid-state imaging device in which light illumination from the substrate backside is performed. In this CMOS solid-state imaging device 111, the pixel transistors included in each pixel, in this example, a transfer transistor Tr1, a reset transistor Tr2 and a amplification transistor Tr3 are formed in the surface side of the semiconductor substrate 112. A photodiode PD is formed in the lower portion of these pixel transistors. The photodiode PD includes, in the inside of the semiconductor substrate 112, an n-type semiconductor region 113 composed of a high impurity region (n+ region) 113A and a low impurity region (n region) 113B, serving as a charge accumulation region, and a p-type semiconductor region (p+ region) 114 having a high impurity concentration located at the surface side thereof.

The vertical transfer transistor Tr1 is configured to have a columnar transfer gate electrode 116 which is embedded within a longitudinal groove 110 reaching the inside of the n-type high concentration impurity region (n+ region) 113A of the photodiode PD in the depth direction from the surface of the semiconductor substrate 112 with a gate insulating film 115 interposed therebetween. An n-type source and drain region 117, serving as a floating diffusion (FD), is formed in the surface of the semiconductor substrate 112 so as to come into contact with the gate insulating film 115. The transfer gate electrode 116 of the vertical transfer transistor Tr1 is formed in a position equivalent to the center of a unit pixel 131, that is, the center of the photodiode PD. A p-type semiconductor region (p+ region) 121 having a high impurity concentration is formed so as to surround the gate insulating film 115 formed within the high impurity concentration region (n+ region) 113A of the photodiode PD.

The reset transistor Tr2 includes a pair of n-type source and drain regions 117 and 118 located at the surface side of the semiconductor substrate 112 and a reset gate electrode 123 formed with a gate insulating film interposed therebetween. The amplification transistor Tr3 includes a pair of n-type source and drain regions 119 and 120 located at the surface side of the semiconductor substrate 112 and a amplification gate electrode 124 formed with a gate insulating film interposed therebetween. A multilayer interconnection layer, in which a multilayered interconnections 126 are formed, is further formed on the semiconductor substrate 112 in which these pixel transistors (Tr1, Tr2, Tr3) are formed, with a interlayer insulating film 125 interposed therebetween. Although not shown in the drawing, a color filter and an on-chip microlens located at a position corresponding to each pixel on the color filter, and the like are further formed in the backside of the semiconductor substrate 112. In FIG. 22, reference numeral 130 indicates a pixel separation region. Reference numeral 131 indicates a unit pixel.

SUMMARY OF THE INVENTION

Incidentally, in the above-mentioned solid-state imaging device 111, when the p-n junction is formed in the deep inside of the substrate by ion implantation, the impurity profile becomes gentler than that of the case where the p-n junction is formed in the vicinity of the substrate surface, and thus the junction capacity per unit area can be hardly sufficiently secured. That is, it is difficult to secure the amount of saturated charges Qs.

In addition, when the vertical transistor for transferring the charges in the vertical direction of the substrate is formed, the gate insulating film 115 is formed by thermal oxidation in the inner wall surface in which different silicon face orientations of the longitudinal groove 110 opened in the vertical direction are mixed. For the purpose of secure reliability of a region in which an electrical field is concentrated, by the face orientation dependency of an oxidation rate, due to a three-dimensional structure of the thinned portion of a thermal oxidation film, the bottom of the longitudinal groove or the inlet of the longitudinal groove, it is necessary that the thickness of the gate insulating film is set to be larger than the thickness of the gate insulating film required for a surface-type transistor. When the thick gate insulating film is adopted, performance of the surface-type transistor becomes lower than that of the related art, or reuse of device parameters of the transistor of the related art is not possible.

In addition, since the interface between the silicon and the insulation film exists in under the periphery of the vertical transfer transistor, white spots are deteriorated by the generation of a dark current from the interface thereof. For the purpose of suppress this dark current, it is considered that the p-type semiconductor region is formed in the interface between the gate insulating film and the silicon under the periphery of the transfer gate electrode buried in the substrate by ion implantation. When the relationship between the impurity distribution of the p-type semiconductor region and the position of the vertical transfer transistor is varied by misalignment of lithography, charge transfer capability of the vertical transfer transistor and hole pinning capability by the above-mentioned p-type semiconductor region are varied. Such a variation causes variation in the characteristics at the time of mass production of the solid-state imaging device.

Further, when non-doped polysilicon which is a gate electrode material for a peripheral CMOS circuit formed by a general dual gate process is used in the vertical electrode at the time of forming the vertical transistor, it cannot be made conductive only by impurity doping through ion implantation and thermal diffusion to a certain degree of depth or more. It is necessary to perform film formation while doping impurities during a process, or to embed another material such as a metal. However, in any of the methods, the material, which is not polysilicon of the related art, is formed in the transistor region of the peripheral circuit. Therefore, it is necessary to remove such another material and form polysilicon, or to implant counter-conductive impurities into the impurity-doped polysilicon and form an electrode. In this manner, a process for forming an electrode is changed, or the impurity amount of the electrode itself is changed, so that the characteristics of the peripheral circuit are varied. In addition, attachment and detachment of the electrode material lead to an increase in the number of processes, and cause deterioration of the processing yield. Here, the dual gate process is a process for manufacturing and dividing gate materials having different work functions into a p-channel MOS transistor and an n-channel MOS transistor. Generally, the dual gate process is a process for manufacturing and dividing the non-doped polysilicon film by patterning through lithography and ion implantation.

According to an embodiment of the present invention, there are provided a solid-state imaging device capable of increasing the amount of saturated charges Qs per unit area and a method of manufacturing the same, by adding a p-n junction formed in a deep position of a semiconductor substrate and a vertical transfer transistor performing charge transfer from the p-n junction to a solid-state imaging device of the related art.

According to another embodiment of the present invention, there is provided an electronic apparatus such as a camera including the above-mentioned solid-state imaging device.

According to still another embodiment of the present the invention, there is provided a three-dimensional transistor applicable to a transfer transistor of pixel transistors of the above-mentioned solid-state imaging device.

A solid-state imaging device according to an embodiment of the present invention includes a pixel region in which pixels including a photoelectric conversion section and a plurality of pixel transistors are arranged. The photoelectric conversion section includes a p-n junction provided close to the surface of the semiconductor substrate and a p-n junction provided in a deep position of the semiconductor substrate, similarly to the solid-state imaging device of the related art. The transfer transistor of the pixel transistors includes a transfer gate electrode extended in a surface of the substrate formed in the surface of the semiconductor substrate, and a transfer gate electrode buried in the substrate which is embedded in the inside of the semiconductor substrate in the vertical direction through the transfer gate electrode extended in a surface of the substrate. The transfer gate electrode extended in a surface of the substrate and the transfer gate electrode buried in the substrate are electrically insulated from each other.

In the solid-state imaging device according to the embodiment of the present invention, since the transfer transistor includes the transfer gate electrode extended in a surface of the substrate and the transfer gate electrode buried in the substrate, and the gate electrodes are electrically insulated from each other, it is possible to apply independent potentials to the transfer gate electrode extended in a surface of the substrate and the transfer gate electrode buried in the substrate.

A method of manufacturing a solid-state imaging device according to another embodiment of the present invention includes the step of forming a photoelectric conversion section, a plane transfer transistor of a transfer transistor, and other pixel transistors in a semiconductor substrate in which pixels of a pixel region are formed. Next, the method includes the steps of: forming a vertical hole which reaches the inside of the semiconductor substrate in the vertical direction through the transfer gate electrode extended in a surface of the substrate formed in the surface of semiconductor substrate with a gate insulating film interposed therebetween; and forming a gate insulating film in the inner wall surface of the vertical hole. Next, the method includes the step of forming a transfer transistor having a transfer gate electrode extended in a surface of the substrate and a vertical gate electrode by embedding a transfer gate electrode buried in the substrate within the vertical hole.

In the method of manufacturing a solid-state imaging device according to the embodiment of the invention, the vertical hole reaching the inside of the semiconductor substrate through the transfer gate electrode extended in a surface of the substrate is form, and the gate insulating film is formed in the inner wall surface of the vertical hole, and then the transfer gate electrode buried in the substrate is embedded within the vertical hole. Thereby, the transfer transistor, having the transfer gate electrode extended in a surface of the substrate and the transfer gate electrode buried in the substrate which are electrically insulated from each other, is formed.

An electronic apparatus according to still another embodiment of the present invention includes an optical lens, a solid-state imaging device, and a signal processing circuit that processes an output signal of the solid-state imaging device. The solid-state imaging device includes a pixel region in which pixels including a photoelectric conversion section and a plurality of pixel transistors are arranged. A transfer transistor of the pixel transistors includes a transfer gate electrode extended in a surface of the substrate formed in the surface of the semiconductor substrate, and a transfer gate electrode buried in the substrate which is embedded in the inside of the semiconductor substrate in the vertical direction through the transfer gate electrode extended in a surface of the substrate. The transfer gate electrode extended in a surface of the substrate and the transfer gate electrode buried in the substrate are electrically insulated from each other.

A three-dimensional MOS transistor according to another embodiment of the present invention includes: a first source region, a second source region and a drain region formed in a semiconductor substrate; a plane gate electrode formed on the semiconductor substrate with a gate insulating film interposed between the first source region and the drain region. Further, the three-dimensional MOS transistor according to the embodiment of the present invention includes: a vertical gate electrode which passes through the plane gate electrode and is embedded in the inside of the semiconductor substrate in the vertical direction gate with a insulating film interposed therebetween; a second source region extension portion extending from the second source region through the inside of the semiconductor substrate to the vertical gate electrode.

In the three-dimensional transistor according to the embodiment of the present invention, when the on-voltage is not applied to the plane gate electrode, the current does not flow from the source region to the drain region even by the application of the on-voltage to the vertical gate electrode. Even when the on-voltage is not applied to the vertical gate electrode, the current flows from the source region to the drain region by the application of the on-voltage to the plane gate electrode. When the on-voltage is applied to all of the vertical gate electrode and the plane gate electrode, the parallel channel is formed around the vertical gate electrode. Therefore, the effective channel width of the plane transistor increases, and the current value from the source region to the drain region increases. In addition, when the on-voltage is applied to the vertical gate electrode, the channel from the second source region to the channel region under the plane gate electrode is formed. When the on-voltage is applied to the plane gate electrode, the current flows from the second source region to the drain region.

With the solid-state imaging device according to the embodiments of the present invention, since the potentials of the transfer gate electrode extended in a surface of the substrate and the transfer gate electrode buried in the substrate can be independently controlled, an electrical field is created in the vertical direction by an optimal potential applied to the transfer gate electrode buried in the substrate, thereby allowing the charge transfer from the deep position inside of silicon to be improved. Thereby, it is possible to increase the amount of saturated charges Qs per unit area.

With the method of manufacturing a solid-state imaging device according to the embodiments of the invention, the materials and the thicknesses of the transfer gate electrode extended in a surface of the substrate of the transfer transistor and the insulation film, and the vertical gate electrode and the insulation film are independently determined. Therefore, it is possible to manufacture a solid-state imaging device having a large amount of saturated charges by adding a charge transfer function in the longitudinal direction through the vertical gate electrode without changing device parameters of the pixel transistor and the peripheral circuit of the existing plane type solid-state imaging device.

With the electronic apparatus according to the embodiments of the present invention, since the electronic apparatus includes the above-mentioned solid-state imaging device, it is possible to provide an electronic apparatus having a large amount of saturated charges Qs per unit area and a large sensitivity and dynamic range even when the pixel is miniaturized.

With the three-dimensional transistor according to the embodiments of the present invention, it is possible to control a bidirectional current.

BRIEF DESCRIPTION OF THE DRAWINGS

FIG. 15 is a schematic cross-sectional view of a main part illustrating a fourth embodiment of the solid-state imaging device according to the invention.

FIG. 22 is a schematic cross-sectional view illustrating an example of the solid-state imaging device of the related art.

DESCRIPTION OF THE PREFERRED EMBODIMENTS

Hereinafter, embodiments for carrying out the invention (hereinafter, referred to as the embodiment) will be described. Meanwhile, description will be made in the following order.

1. Schematic Configuration Example of CMOS Solid-State Imaging Device

2. First Embodiment (Configuration Example and Manufacturing Method Example of Solid-State Imaging Device)

3. Second Embodiment (Configuration Example of Solid-State Imaging Device)

4. Third Embodiment (Configuration Example of Solid-State Imaging Device)

5. Fourth Embodiment (Configuration Example of Solid-State Imaging Device)

6. Fifth Embodiment (Configuration Example of Solid-State Imaging Device)

7. Sixth Embodiment (Configuration Example of Electronic Apparatus)

8. Seventh Embodiment (Configuration Example of Three-Dimensional Transistor)

1. Schematic Configuration Example of CMOS Solid-State Imaging Device

Figure 1:
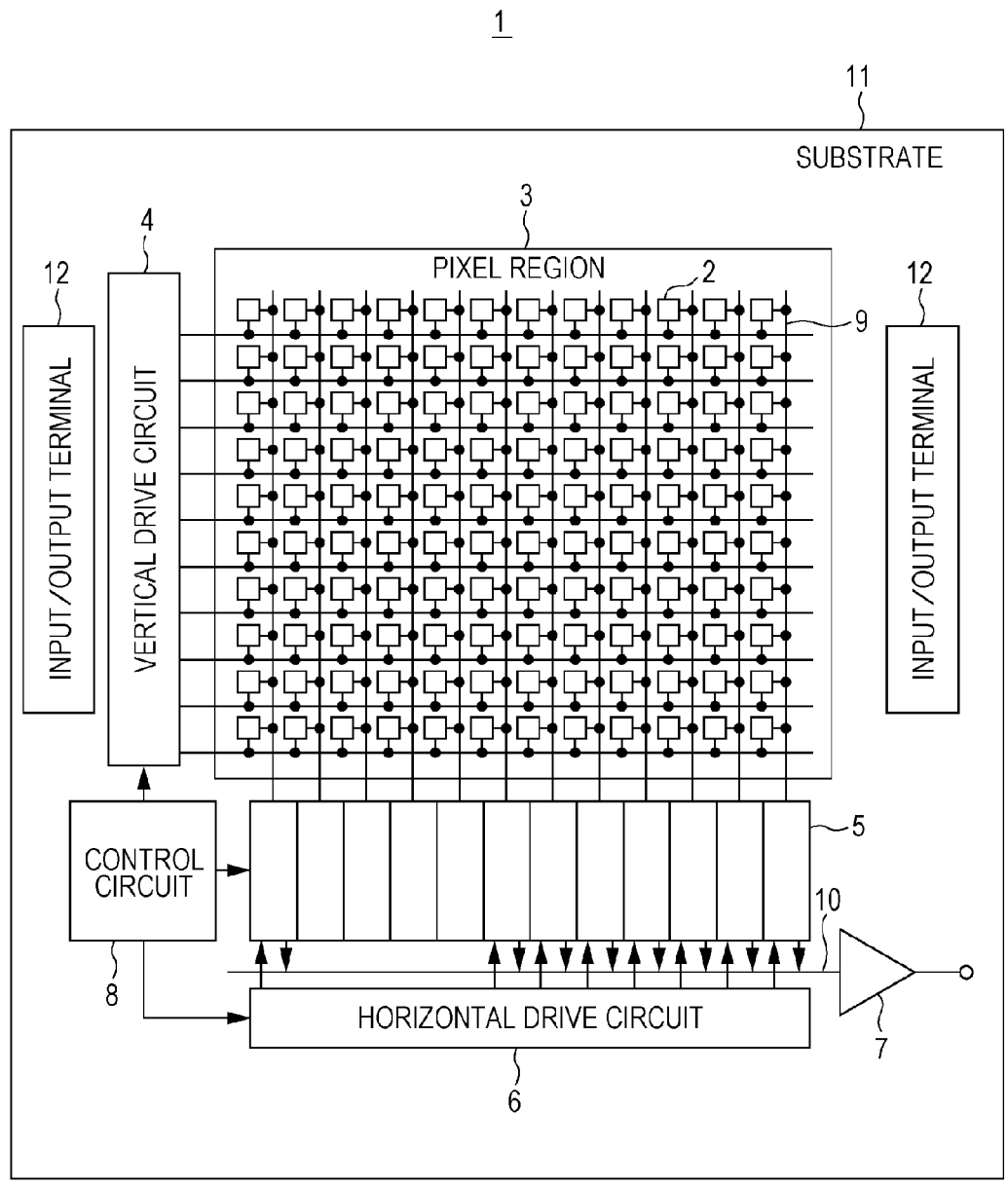
FIG. 1 is a schematic diagram illustrating an example of a solid-state imaging device applied to each of the embodiment of the invention.

FIG. 1 shows a schematic configuration of an example of a MOS solid-state imaging device applied to each of the embodiments of the invention. As shown in FIG. 1, a solid-state imaging device 1 of the example includes a pixel region (so-called imaging region) 3 in which a plurality of pixels 2 including a photoelectric conversion section is regularly two-dimensionally arranged, and peripheral circuit sections, in a semiconductor substrate 11, for example, a silicon substrate. A unit pixel composed of one photoelectric conversion section and a plurality of pixel transistors can be used as the pixel 2. In addition, a structure in which a plurality of photoelectric conversion sections shares the other pixel transistors except for a transfer transistor, a so-called pixel-shared structure can be used as the pixel 2. A plurality of pixel transistors can be composed of three transistors or four transistors as mentioned above.

The peripheral circuit sections include a vertical drive circuit 4, a column signal processing circuit 5, a horizontal drive circuit 6, an output circuit 7, a control circuit 8 and the like.

The control circuit 8 receives data used for giving instructions of an input clock, an operation mode and the like, and outputs data such as internal information of the solid-state imaging device. That is, the control circuit 8 generates clock signals or control signals serving as a reference of operations of the vertical drive circuit 4, the column signal processing circuit 5, the horizontal drive circuit 6 and the like on the basis of a vertical synchronizing signal, a horizontal synchronizing signal and a master clock. These signals are input to the vertical drive circuit 4, the column signal processing circuit 5, the horizontal drive circuit 6 and the like.

The vertical drive circuit 4 is composed of, for example, shift registers, selects a pixel drive interconnection, supplies a pulse for driving the pixels to the selected pixel drive interconnection, and drives the pixels by row unit. That is, the vertical drive circuit 4 selectively scans each of the pixels 2 of the pixel region 3 sequentially in the vertical direction by row unit. A pixel signal based on the signal charges generated in response of the amount of light received in, for example, a photodiode serving as the photoelectric conversion element of each of the pixels 2 is supplied to the column signal processing circuit 5 through the vertical signal line 9.

The column signal processing circuit 5 is disposed for each column, for example, of pixel 2, and performs signal processing, such as denoising, on a signal output from the pixels 2 in one low for each pixel column. That is, the column signal processing circuit 5 performs signal processing such as CDS for removing fixed pattern noise unique to the pixel 2, signal amplification, and A/D conversion. In an output stage of the column signal processing circuit 5, a horizontal selection switch (not shown) is connected between the horizontal signal line 10 and the output stage.

The horizontal drive circuit 6 is composed of, for example, shift registers, and sequentially outputs horizontal scanning pulses, so that the horizontal drive circuit selects each of the column signal processing circuits 5 in order, and then outputs the pixel signals from each of the column signal processing circuits 5 to the horizontal signal line 10.

The output circuit 7 performs signal processing on signals sequentially supplied from each of the column signal processing circuits 5 through the horizontal signal line 10, and then output the signals. For example, there may be cases where only buffering is performed, and there may also be cases where black level adjustment, column variation correction, various types of digital signal processing and the like are performed. An input and output terminal 12 exchanges signals with the outside.

Figure 2:
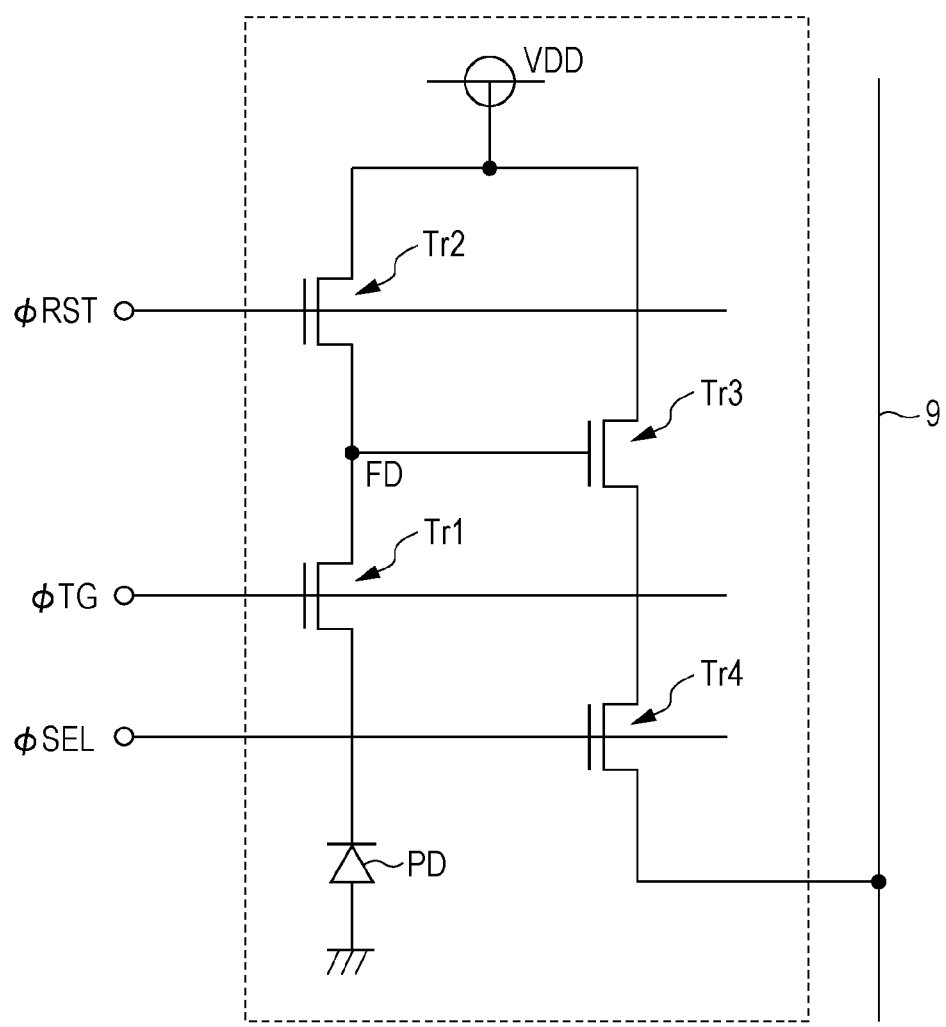
FIG. 2 is an equivalent circuit diagram illustrating an example of a unit pixel.

FIG. 2 is an equivalent circuit diagram of a unit pixel 21. The unit pixel 21 according to the example includes a photodiode PD serving as the photoelectric conversion section, and four pixel transistors. Four pixel transistors include a transfer transistor Tr1, a reset transistor Tr2, an amplification transistor Tr3 and a selection transistor Tr4. Here, an n-channel MOS transistor, for example, is used as these pixel transistors Tr1 to Tr4.

The photodiode PD is connected to the transfer transistor Tr1. The transfer transistor Tr1 is connected to the reset transistor Tr2 through a floating diffusion portion FD. The signal charges (here, electrons) which are photoelectrically converted by the photodiode PD and accumulated herein are transferred to the floating diffusion portion FD by application of a transfer pulse φTRG to a gate of the transfer transistor Tr1.

The floating diffusion portion FD is connected to a gate of the amplification transistor Tr3. A drain of the amplification transistor Tr3 and a drain of the reset transistor Tr2 are connected to a power supply VDD. Here, a source of the reset transistor Tr2 (drain of the transfer transistor Tr1) is configured as the floating diffusion portion FD. Prior to transfer of the signal charges from the photodiode PD to the floating diffusion portion FD, a potential of the floating diffusion portion FD is reset by application of a reset pulse φRST to a reset gate.

A source of the amplification transistor Tr3 is connected to a drain of the selection transistor Tr4, and a source of the selection transistor is connected to the vertical signal line 9. The selection transistor is changed to an on-state by application of a selection pulse φSEL to a gate of the selection transistor Tr4, so that the pixel 2 is selected. The amplification transistor Tr3 outputs the potential of the floating diffusion portion FD after reset by the reset transistor Tr2 as a reset level to the vertical signal line 9 through the selection transistor Tr4. Further, the amplification transistor Tr3 outputs the potential of the floating diffusion portion FD after transfer of the signal charges by the transfer transistor Tr1 as a signal level to the vertical signal line 9 through the selection transistor Tr4. Meanwhile, it is also possible to adopt the configuration in which the selection transistor Tr4 is connected between the power supply VDD and the drain of the amplification transistor Tr3. In this case, the source of the amplification transistor Tr3 is connected to the vertical signal line 9.

2. First Embodiment

Configuration Example of Solid-State Imaging Device

Figure 3:
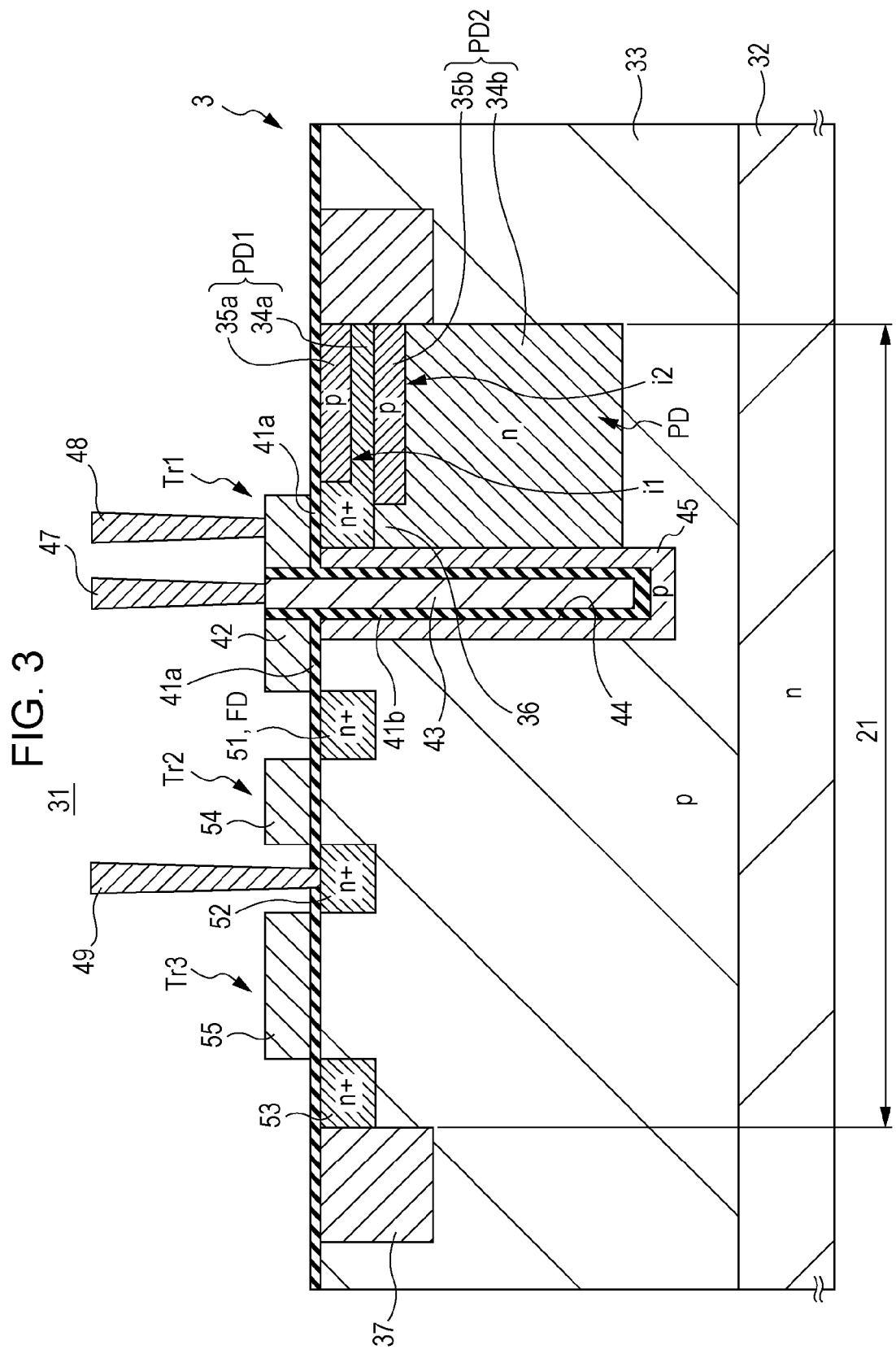
FIG. 3 is a schematic cross-sectional view of a main part illustrating a first embodiment of the solid-state imaging device according to the invention.
Figure 4:
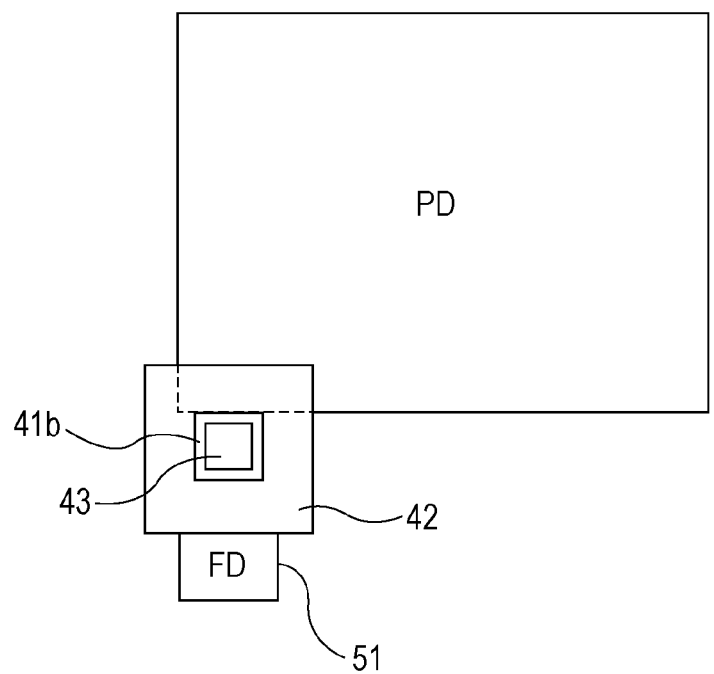
FIG. 4 is a schematic plan view of a main part illustrating the first embodiment of the solid-state imaging device according to the invention.

FIG. 3 and FIG. 4 show a first embodiment of the solid-state imaging device according to the invention. The embodiment is an example applied to the CMOS solid-state imaging device in which the unit pixel 21 is arranged. FIG. 3 is a schematic cross-sectional view of a main part of the pixel region 3, and FIG. 4 is a schematic plan view illustrating the photodiode which is a photoelectric conversion section and the portion of the transfer transistor.

As shown in FIG. 3 and FIG. 4, a solid-state imaging device 31 according to the first embodiment is configured such that a plurality of unit pixels 21 including the photodiode PD serving as a photoelectric conversion section and the pixel transistors is two-dimensionally arranged in the pixel region 3 of a semiconductor substrate 32. A first conductivity type, for example, n-type semiconductor substrate, or a second conductivity type, for example, p-type semiconductor substrate can be used as the semiconductor substrate 32. The semiconductor substrate 32 can be replaced with a semiconductor well region. In the example, a p-type semiconductor well region 33 is formed on the n-type semiconductor 32, and the photodiode PD and the pixel transistors are formed in this p-type semiconductor well region 33. Each of the unit pixels 21 is separated by a separation region 37.

Among the pixel transistors, the transfer transistor Tr1 is formed to have a transfer gate electrode 42 extended in a surface of the substrate formed on the substrate surface with a gate insulating film 41a interposed therebetween, and a transfer gate electrode 43 buried in the substrate which is embedded in the inside of the substrate in the vertical direction through this transfer gate electrode 42 extended in a surface of the substrate. The transfer gate electrode 43 buried in the substrate is embedded within a vertical hole 44, vertically formed on the semiconductor substrate so as to pass through the transfer gate electrode 42 extended in a surface of the substrate, with a gate insulating film 41b interposed therebetween. The transfer gate electrode 42 extended in a surface of the substrate and the transfer gate electrode 43 buried in the substrate are electrically insulated from each other by the gate insulating film. A p-type semiconductor region 45 in the longitudinal direction for suppressing a dark current and white spots is formed in the interface between the gate insulating film 41b under the periphery of the transfer gate electrode 43 buried in the substrate and the silicon substrate, that is, the semiconductor well region 33. That is, the transfer transistor Tr1 includes a vertical transistor having the transfer gate electrode 43 buried in the substrate, and a plane transistor having the transfer gate electrode 42 extended in a surface of the substrate.

The photodiode PD is formed by laminating a plurality of photodiodes in the depth direction of the p-type semiconductor well region 33. This multistage photodiode is configured such that when accumulated charges located at one photodiode overflow between the adjacent photodiodes during charge accumulation, the charges move to the other photodiode.

The photodiode PD of the example is formed to have a first photodiode PD1 formed on the surface side of the p-type semiconductor well region 33, and a second photodiode PD2 embedded thereunder. The first photodiode PD1 includes a first n-type semiconductor region 34a formed on the substrate surface side and a first p-type semiconductor region 35a formed on the surface of the n-type semiconductor region 34a so that p-n junction j1 is formed in the vicinity of the surface of the semiconductor substrate. The second photodiode PD2 includes an n-type semiconductor region 34b and a p-type semiconductor region 35 so that p-n junction j2 is formed at a position deeper than the inside of the semiconductor substrate, that is, the above-mentioned p-n junction j1. Hereinafter, the n-type semiconductor region 34a is called a surface n-type semiconductor region, and the n-type semiconductor region 34b is called an embedded n-type semiconductor region.

The surface n-type semiconductor region 34a is set to have a higher impurity concentration than that of the embedded n-type semiconductor region 34b. In addition, the p-type semiconductor region 35a of the substrate surface suppresses both the dark current and the white spots, and is set to have a higher impurity concentration than that of the p-type semiconductor region 35b of the embedded side. Both of the n-type semiconductor regions 34a and 34b are all formed in contact with the p-type semiconductor region 45 in the longitudinal direction under the periphery of the transfer gate electrode 43 buried in the substrate.

The p-type semiconductor region 35b is formed between both of the n-type semiconductor regions 34a and 34b so as to be in contact with the surface n-type semiconductor region 34a. The p-type semiconductor region 35b does not completely separate the surface n-type semiconductor region 34a and the embedded n-type semiconductor region 34b, and is formed away from the p-type semiconductor region 45 in the longitudinal direction. That is, the embedded n-type semiconductor region 34b and the surface n-type semiconductor region 34a are connected to each other by an n-type narrow portion 36 interposed between the p-type semiconductor region 35b and the p-type semiconductor region 45 in the longitudinal direction. The n-type narrow portion 36 is formed by a portion of the embedded n-type semiconductor region 34b.

The transfer gate electrode 43 buried in the substrate is formed on one end of the photodiode PD, and is formed deeper than the p-n junction j2 formed by the p-type semiconductor region 35b and the n-type semiconductor region 34b of the second photodiode PD2. In the drawing, the transfer gate electrode 43 buried in the substrate is formed deeper than the n-type semiconductor region 34b of the second photodiode PD2. However, in a strict sense, the transfer gate electrode 43 buried in the substrate is not necessary to be formed deeper than the p-n junction plane formed by the region 35b and the region 34b. The p-n junction plane and an inversion channel generated by a potential applied to the transfer gate electrode 43 buried in the substrate may be connected to each other, and the p-n junction plane is also potential-modulated by an electrical field from the transfer gate electrode 43 buried in the substrate to retreat in a direction away from the transfer gate electrode 43 buried in the substrate, thereby allowing the charges to be transferred.

The p-type semiconductor region 45 in the longitudinal direction is formed through ion implantation. However, when the width in a lateral direction is excessively large or the impurity concentration is excessively high, the n-type narrow portion 36 is excessively narrowed, and thus there may be a concern that the embedded n-type semiconductor region 34b and the surface n-type semiconductor region 34a are electrically separated from each other. For this reason, the p-type semiconductor region 45 in the longitudinal direction is preferably formed so that the width in a lateral direction thereof, so-called the diffusion width becomes small and the impurity concentration becomes low, but it is necessary to secure the hole concentration required for pinning of the dark current.

The gate insulating film 41a under the transfer gate electrode 42 extended in a surface of the substrate and the gate insulating film 41b under the periphery of the transfer gate electrode 43 buried in the substrate can be formed with a different thickness. When the transfer gate electrode 43 buried in the substrate is formed, a longitudinal groove is formed in the depth direction of the substrate, and the gate insulating film 41b is formed in the inner wall surface of the longitudinal groove by thermal oxidation thereafter. Variation in the thickness of the gate insulating film occurs due to each silicon face orientation mixed in the inner surface of this longitudinal groove. For the purpose of obtaining reliability of the gate insulating film, the gate insulating film 41b under the periphery of the transfer gate electrode 43 buried in the substrate of a location having the smallest thickness is formed thicker than the gate insulating film 41a under the transfer gate electrode 42 extended in a surface of the substrate. Since the gate insulating film 41a under the transfer gate electrode 42 extended in a surface of the substrate or the gate insulating film of the MOS transistor of the peripheral circuit, which is formed thick similarly to the gate insulating film 41b under the periphery of the transfer gate electrode 43 buried in the substrate, affects the characteristics, it is preferably formed with a normal thickness and thus formed thinner than the gate insulating film 41b.

In the above-mentioned gate insulating film 41b, it is possible to select the material and the film thickness suitable for a request from the reliability and the characteristics of the vertical transistor having the transfer gate electrode 43 buried in the substrate, regardless of the gate insulating film of the plane transistor including the gate insulating film 41a.

Independent connection conductors 47 and 48 are connected to the transfer gate electrode extended in a surface of the substrate and the transfer gate electrode buried in the substrate so that the gate pulses are applied thereto independently of each other. These connection conductors 47 and 48 are connected to any interconnections of interconnection layers having multilayered interconnections formed on the substrate which are not shown in the drawing.

On the other hand, n-type source and drain regions 51, 52 and 53 included in each of the pixel transistors are formed in the surface of the p-type semiconductor well region 33. The source/drain 51 in the proximity of the end of the transfer gate electrode 42 extended in a surface of the substrate is a region serving as the floating diffusion portion (FD). The reset transistor Tr2 includes a pair of the source and drain regions 51 and 52 and a reset gate electrode 54 formed with the gate insulating film 41a interposed therebetween. The amplification transistor Tr3 includes a pair of the source and drain regions 52 and 53 and an amplification gate electrode 55 formed with the gate insulating film 41a interposed therebetween. Although not shown, the selection transistor Tr4 includes a pair of the source and drain regions and a selection gate electrode formed with the gate insulating film interposed therebetween. The source and drain region 52 is connected to a connection conductor 49.

The positional relationship between the transfer gate electrode 43 buried in the substrate and the floating diffusion portion FD may not come into contact with each other. Since the charges can be transferred through a channel formed by the transfer gate electrode 42 extended in a surface of the substrate, the transfer gate electrode 43 buried in the substrate can be disposed for each inside of the region of the transfer gate electrode 42 extended in a surface of the substrate.

Operation of First Embodiment

An operation of the solid-state imaging device 31 according to the first embodiment will be described. The solid-state imaging device 31 of the embodiment has the photodiode PD (PD1, PD2) with a two-stage structure in the depth direction of the semiconductor substrate (that is, p-type semiconductor well region 33). In the case of this photodiode PD with a two-stage structure, two charge transfers are performed as the charge transfer. That is, two charge transfers are performed on one lateral direction transfer in which the charge transfer is performed from the surface-side photodiode PD1 to the floating diffusion portion, and the other longitudinal direction transfer in which the other charge transfer is performed from the embedded-side photodiode PD2 toward the channel region generated by the transfer gate electrode extended in a surface of the substrate. The same is true of the multistage photodiode PD. That is, herein performed are two charge transfers on one lateral direction transfer of the charges from the surface-side photodiode to the floating diffusion portion (FD), and the other longitudinal direction transfer of the charges from a plurality of embedded-side photodiodes toward the channel region generated by the transfer gate electrode extended in a surface of the substrate.

At the time of charge accumulation, a negative bias voltage is applied to the transfer gate electrode 42 extended in a surface of the substrate and the transfer gate electrode 43 buried in the substrate. The charges can be accumulated both the surface n-type semiconductor region 34a and the embedded n-type semiconductor region 34b, and thus the amount of saturated charges Qs increases. The interface between the semiconductor and the gate insulating film under the plane transfer gate 42 and under the periphery of the transfer gate electrode 43 buried in the substrate is hole-pinned by this negative bias voltage, and thus generation of the dark current is suppressed. The width of the n-type narrow portion 36 is further narrowed due to the hole pinning by application of the negative bias voltage, that is, the hole accumulation, and thus the potential barrier occurs. Even when this potential barrier impairs the movement of the charges between the upper and lower n-type semiconductor regions 34a and 34b, it is set lower than the potential barrier between the adjacent pixels to thereby blocking overflow into the adjacent pixels.

At the time of the charge transfer, a positive voltage is applied to the transfer gate electrode 42 extended in a surface of the substrate and the transfer gate electrode 43 buried in the substrate. The potential barrier of the n-type narrow portion 36 is modulated by the potential of the transfer gate electrode 43 buried in the substrate, and the channel region in the longitudinal direction is formed. The charges of the embedded n-type semiconductor region 34b are transferred to the channel region generated by the transfer gate electrode 42 extended in a surface of the substrate through this channel region in the longitudinal direction. Simultaneously, the charges of the surface n-type semiconductor region 34a are transferred to the floating diffusion portion (FD) through the channel region formed by the potential of the transfer gate electrode 42 extended in a surface of the substrate.

Individual potentials can be applied to the electrically separated transfer gate electrode 42 extended in a surface of the substrate and the transfer gate electrode 43 buried in the substrate, respectively, and the same potential can also be applied thereto.

When the individual potentials are applied to the transfer gate electrode 42 extended in a surface of the substrate and the transfer gate electrode 43 buried in the substrate, respectively, it is possible to strengthen the hole pinning under the periphery of the transfer gate electrode 43 buried in the substrate. For example, although the p-type semiconductor region 45 in the longitudinal direction is formed through several times of ion implantation from the upper portion by changing driving energy, the width of the p-type semiconductor region 45 varies due to misalignment in a lithography process and the like. The larger the width of the p-type semiconductor region 45 is, the harder the charge transfer becomes. Therefore, when the width is reduced, the hole pinning is weakened.

Moreover, in the case of the pixel-shared structure, the misalignment changes the characteristics of each pixel, and thus it is considered that the concentration of the p-type semiconductor region 45 is lowered and the variation state of the characteristics is reduced. When the concentration of the p-type semiconductor region is lowered, the hole pinning is weakened.

At the time of charge accumulation, it is possible to strengthen the hole pinning under the periphery of the transfer gate electrode 43 buried in the substrate by making a negative bias voltage applied to the transfer gate electrode 43 buried in the substrate larger in absolute value than that of the transfer gate electrode 42 extended in a surface of the substrate. In addition, deterioration of reliability generated by applying a negative potential which is large in absolute value can be prevented by reducing the film thickness of 41b. The hole pinning under the transfer gate electrode 42 extended in a surface of the substrate can be maintained similarly to that of the related art.

FIG. 5 to FIG. 10 show patterns of the waveform and timing of voltages (transfer pulse) TRG applied to the transfer gate electrode 42 extended in a surface of the substrate, and voltages (transfer pulse) VG applied to the transfer gate electrode 43 buried in the substrate.

Figure 5:
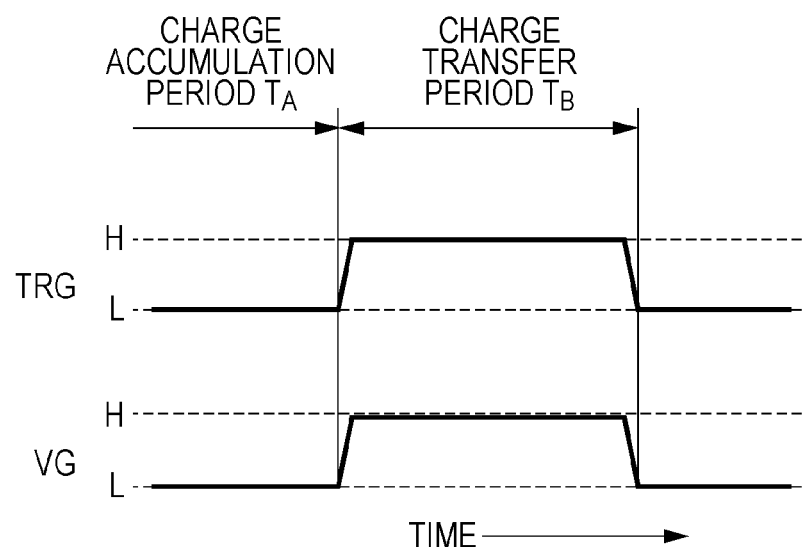
FIG. 5 is a timing diagram (first example) illustrating drive waveforms of transfer pulses according to the invention.

The pattern of FIG. 5 is a case where the transfer gate electrode 42 extended in a surface of the substrate and the transfer gate electrode 43 buried in the substrate are electrically integrated with each other, and the transfer transistor Tr1 is on/off driven constantly by the same potential. That is, the voltage TRG applied to the transfer gate electrode 42 extended in a surface of the substrate and the voltage VG applied to the transfer gate electrode 43 buried in the substrate are all set to the same timing, high level, and low level in the charge accumulation period $T_A$ and the charge transfer period $T_B$.

Patterns of FIG. 6 to FIG. 10 are all examples where the independent individual voltages TRG and VG are applied to the transfer gate electrode 42 extended in a surface of the substrate and the transfer gate electrode 43 buried in the substrate, respectively, through the separate connection conductors 48 and 47.

Figure 6:
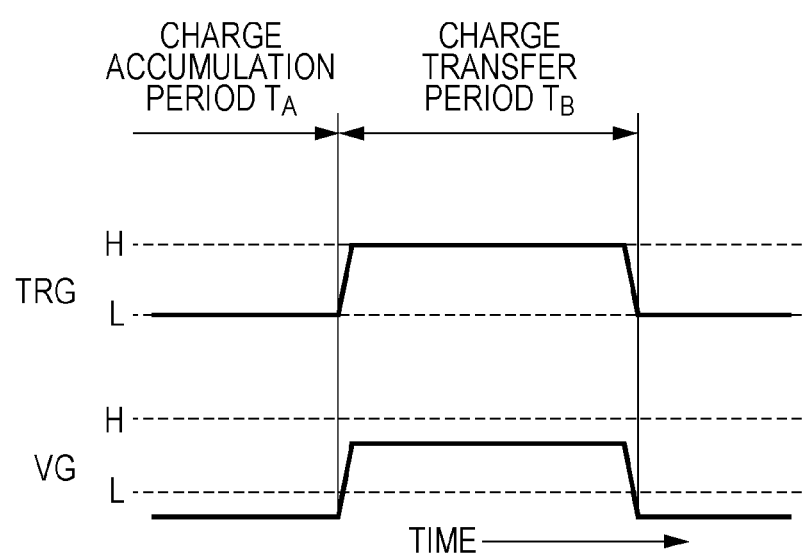
FIG. 6 is a timing diagram (second example) illustrating the drive waveforms of the transfer pulses according to the invention.

The pattern of FIG. 6 is a case where the voltage TRG applied to the transfer gate electrode 42 extended in a surface of the substrate and the voltage VG applied to the transfer gate electrode 43 buried in the substrate are set to the same timing, and the high level and the low level of the voltages are set so that the voltage VG is lower than the voltage TRG. The hole pinning at the transfer gate electrode 43 side buried in the substrate is strengthened in the charge accumulation period $T_A$.

As shown in another embodiment described later, it is possible to form the transfer gate electrode 42 extended in a surface of the substrate and the transfer gate electrode 43 buried in the substrate with materials having each different work function, and to apply the same voltage to the transfer gate electrode 42 extended in a surface of the substrate and the transfer gate electrode 43 buried in the substrate using the connection conductors 48 and 47 as a common conductor. In this case, the hole pinning of the transfer gate electrode 43 side buried in the substrate is strengthened further than that of the transfer gate electrode 42 side extended in a surface of the substrate. That is, there is the same effect that the voltage VG having a lower level than the voltage level of the transfer gate electrode 42 extended in a surface of the substrate is applied to the transfer gate electrode 43 buried in the substrate, and the effect is substantially the same as the pattern of FIG. 6. Different voltages may be applied to the transfer gate electrode 42 extended in a surface of the substrate and the transfer gate electrode 43 buried in the substrate.

Figure 7:
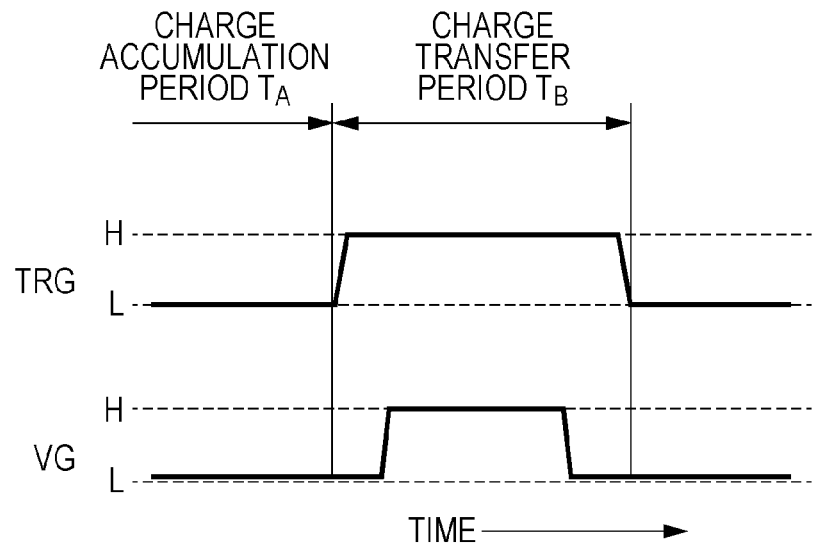
FIG. 7 is a timing diagram (third example) illustrating the drive waveforms of the transfer pulses according to the invention.

The pattern of FIG. 7 delays and turns on the transfer gate electrode 43 buried in the substrate (voltage VG) after the transfer gate electrode 42 extended in a surface of the substrate (voltage TRG) is turned on, and delays and turns off the transfer gate electrode 42 extended in a surface of the substrate (voltage TRG) after the transfer gate electrode 43 buried in the substrate (voltage VG) is turned off. The voltage TRG and the high level and the low level of the voltage VG are the same. Timing of the voltage TRG and the voltage VG may be set inversely to that of FIG. 7. Since the charges of the surface-side photodiode PD1 are first transferred to the floating diffusion portion FD by first turning on the transfer gate electrode 42 extended in a surface of the substrate, the charge transfer from the embedded photodiode PD2 is easily performed. Since the transfer gate electrode buried in the substrate is first turned off, the charges hardly remain in the embedded photodiode PD2. In addition, the channel of the transfer gate electrode 42 extended in a surface of the substrate is narrowed, and thus it is possible to suppress the back flow of the charges from the floating diffusion portion FD to the photodiode PD when the transfer gate electrode 42 extended in a surface of the substrate is turned off.

Figure 8:
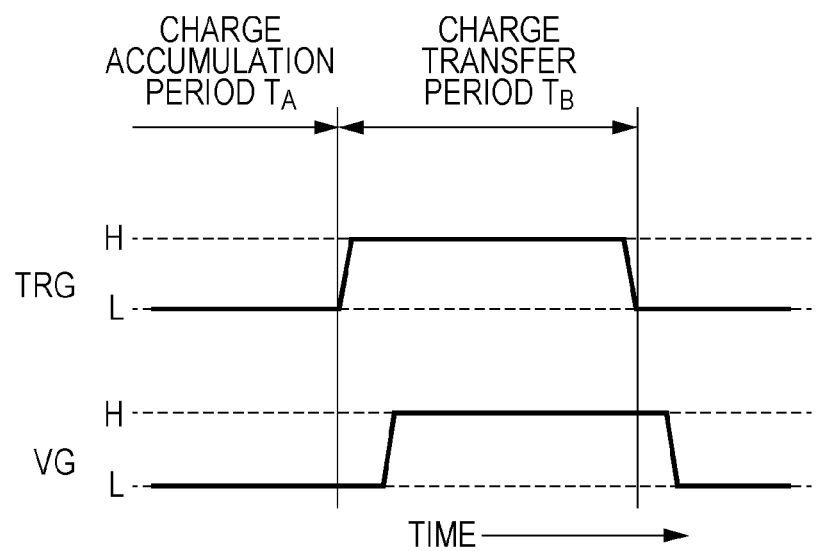
FIG. 8 is a timing diagram (fourth example) illustrating the drive waveforms of the transfer pulses according to the invention.

The pattern of FIG. 8 delays and turns on the transfer gate electrode 43 buried in the substrate (voltage VG) after the transfer gate electrode 42 extended in a surface of the substrate (voltage TRG) is turned on, and delays and turns off the transfer gate electrode 43 buried in the substrate (voltage VG) after the transfer gate electrode 42 extended in a surface of the substrate (voltage TRG) is turned off. The voltage TRG and the high level and the low level of the voltage VG are the same. Timing of the voltage TRG and the voltage VG may be set inversely to that of FIG. 8. This can be actually generated even if simultaneously driving because the capacity of the transfer gate electrode 43 buried in the substrate is larger than that of the transfer gate electrode 42 extended in a surface of the substrate. That is, even when the pulses are turned on at the driving side, shift is generated in the pulse rise time due to the capacity difference. Even when the transfer gate electrode 42 extended in a surface of the substrate having a small capacity is driven fast, and the transfer gate electrode 43 buried in the substrate having a large capacity is driven slowly, the transfer can be completed by quickly turning-off of the transfer gate electrode 42 extended in a surface of the substrate.

Figure 9:
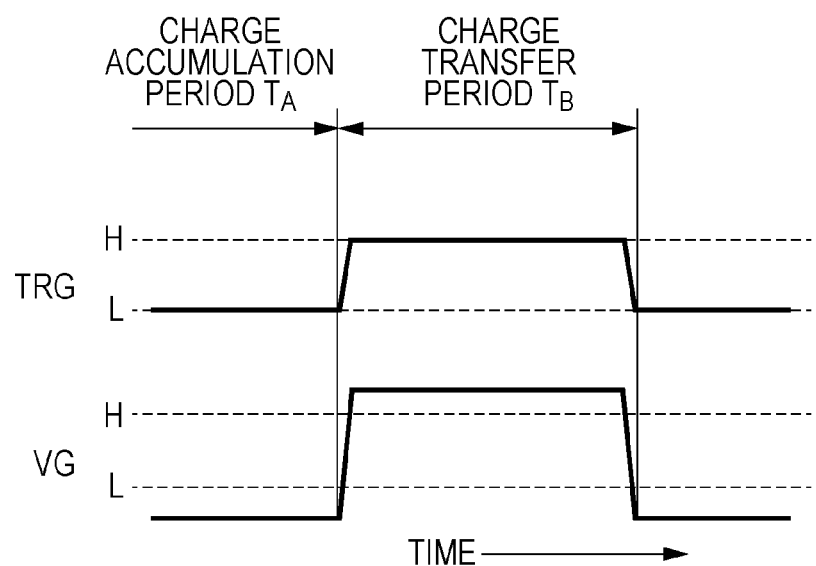
FIG. 9 is a timing diagram (fifth example) illustrating the drive waveforms of the transfer pulses according to the invention.

The pattern of FIG. 9 makes the amplitude between the high and low levels of the voltage VG larger than the amplitude between the high and low levels of the voltage TRG. The relationship between the amplitudes of the voltage TRG and the voltage VG may be set inversely to those of FIG. 9. This pattern can improve the transfer of the charges in the longitudinal direction by applying a large positive bias at the time of the transfer while strengthening a negative bias of the gate and pinning a dark current from the transfer gate electrode 43 buried in the substrate.

Figure 10:
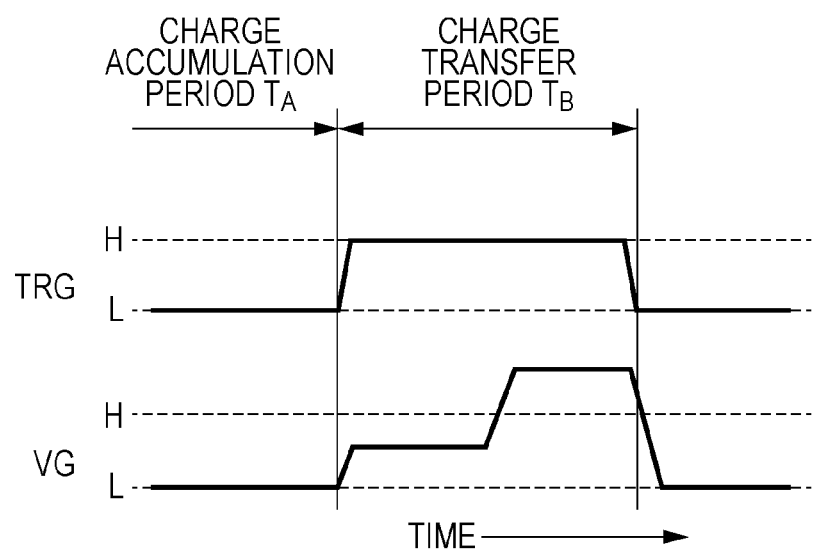
FIG. 10 is a timing diagram (sixth example) illustrating the drive waveforms of the transfer pulses according to the invention.

When the transfer gate electrode 42 extended in a surface of the substrate (voltage TRG) is turned on, the pattern of FIG. 10 sets the amplitude of the voltage VG to turn on the transfer gate electrode 43 buried in the substrate to an intermediate potential lower than the high level of the voltage TRG, and in the middle, the pattern sets the potential of the voltage VG to a potential higher than the voltage TRG. After that, the voltage TRG and the voltage VG are all set to a low level, and then the transfer gate electrode 42 extended in a surface of the substrate and the transfer gate electrode 43 buried in the substrate are turned off. The potential relationship between the voltage TRG and the voltage VG may be set inversely to those of FIG. 10.

The optimal pattern of these patterns to be used depends on each of the potential designs. The position of the charge transfer potential barrier, the potential of the floating diffusion portion FD, the gate length of the transfer gate electrode 42 extended in a surface of the substrate, the depth of the transfer gate electrode 43 buried in the substrate and the like are different under various conditions.

According to the solid-state imaging device 32 of the first embodiment, the transfer transistor Tr1 includes transistors having a three-dimensional structure which are composed of the vertical transfer transistor and the plane transfer transistor, and the potentials of the transfer gate electrode 43 buried in the substrate and the transfer gate electrode 42 extended in a surface of the substrate are controlled independently of each other. Thereby, the electrical field in the vertical direction is created by the potential applied to the transfer gate electrode 43 buried in the substrate, and thus the charge transfer can be further improved. This enables the degree of freedom in the depth direction to be increased in s potential design of the photodiode, and enables the defective transfer not to be caused even when a photodiode having a larger amount of accumulated charges is formed.

In addition, the channel interface under the periphery of the transfer gate electrode buried in the substrate has a larger dark current (hole-electron pair generation), generated by the difference between the surface roughness and the silicon face orientation, than the interface of the Si surface. Therefore, it is necessary to increase the concentration of the hole (or electron when the signal charge described later is used as a hole) required for pinning (annihilation of the minority carrier with the majority carrier). In the embodiment, for this, it is possible to apply a negative (or positive) potential larger than that of the transfer gate electrode 42 extended in a surface of the substrate to the transfer gate electrode 43 buried in the substrate.

The multistage laminate photodiode PD (PD1, PD2) having a p-n junction near to the surface of the semiconductor substrate and a p-n junction within the semiconductor substrate are included in a vertical (depth) direction of the semiconductor substrate. By including the multistage photodiode PD, it is possible to sufficiently secure the amount of saturated charges Qs without reducing the amount even when the pixel is miniaturized. It is possible to satisfy both pixel miniaturization and ensuring of the amount of saturated charges Qs.

Since the transfer gate electrode 42 extended in a surface of the substrate and the transfer gate electrode 43 buried in the substrate are insulated from each other, different potentials can be applied thereto. This enables the optimal potential suitable for roles, reliability, driving methods and the like of each of the electrodes 42 and 43 to be set, or enables the period at which the potential is temporally varied to be changed.

For example, the vertical transistor has a portion in which an electrical field is concentrated existing in the bottom or the opening of the vertical hole due to a three-dimensional structure, and long-term reliability of the gate insulating film becomes lower than that of the plane transistor. However, in the embodiment, the transfer transistor Tr1 includes three-dimensional transistors which are composed of the vertical transistor and the plane transistor. Since the thicknesses of the gate insulating film 41a of the plane transistor and the gate insulating film 41b of the vertical transistor can be changed in the three-dimensional transistor of the embodiment, it is possible to secure sufficient reliability without affecting the char-acteristics of the plane transistor. In addition, the vertical transistor has the interface with different silicon face orientation due to the three-dimensional structure, and has the number of interface orders and the amount of generated dark current larger than those of the plane transistor. However, in the vertical transistor, it is possible to suppress the generation of the white spots due to the dark current through the hole induction by applying a negative bias larger than that of the plane transistor. It is possible to use the gate insulating film having a necessary thickness in response to a necessary negative bias.

Further description will be made. Since the transfer transistor includes the transfer gate electrode 42 extended in a surface of the substrate and the transfer gate electrode 43 buried in the substrate which are electrically separated from each other, and has a configuration in which the potentials are applied thereto independently of each other, it is possible to cause the electrical fields under the transfer gate electrode 42 extended in a surface of the substrate and under the periphery of the transfer gate electrode 43 buried in the substrate to differ from each other. That is, the potentials under the transfer gate electrode 42 extended in a surface of the substrate and under the periphery of the transfer gate electrode 43 buried in the substrate can be controlled with potentials suitable for each.

For example, at the time of the charge accumulation, a negative bias voltage higher than a negative bias voltage applied to the transfer gate electrode 42 extended in a surface of the substrate can be applied to the transfer gate electrode 43 buried in the substrate independently of the transfer gate electrode 42 extended in a surface of the substrate. It is possible to secure the hole concentration necessary for pinning for suppression of the dark current under the periphery of the transfer gate electrode 43 buried in the substrate by applying this higher negative bias voltage. That is, a state of the hole pinning under the transfer gate electrode 42 extended in a surface of the substrate is set to the same as normal, and a state of the hole pinning under the periphery of the transfer gate electrode 43 buried in the substrate can be strengthened further than this state of the hole pinning. Thereby, the generation of the white spots due to the dark current is suppressed.

Therefore, it is possible to suppress the generation of variation of the pixel characteristics due to misalignment of the transfer gate electrode 43 buried in the substrate and the p-type semiconductor region 45 which emerges as a problem in forming the p-type semiconductor region 45 under the periphery of the transfer gate electrode 43 buried in the substrate by lithography and ion implantation at the time of manufacturing.

As the gate insulating film 41b under the periphery of the transfer gate electrode 43 buried in the substrate, it is possible to select the material and the film thickness suitable for a request from the reliability and the characteristics of the vertical transistor regardless of the gate insulating film of the plane transistor. It is possible to form the vertical transistor without affecting the pixel transistor and the MOS transistor of the peripheral circuit by selecting the material and the film thickness of the gate insulating film 41b mentioned above.

Since the voltages are applied independently to the transfer gate electrode 42 extended in a surface of the substrate and the transfer gate electrode 43 buried in the substrate, it is possible to select the patterns such as the voltage levels and the application timing of the voltage TRG and the voltage VG in accordance with an object, as shown in FIG. 5 to FIG. 10.

The transfer gate electrode 43 buried in the substrate can control the charge transfer from the embedded n-type semiconductor region 34b to the surface n-type semiconductor region 34a by modulating the potential barrier of the n-type narrow portion 36 at the time of the charge transfer. In addition, the potentials and the timing of the transfer gate electrode 42 extended in a surface of the substrate and the transfer gate electrode 43 buried in the substrate are changed. Thereby, it is possible to independently control the charge transfer from the surface n-type semiconductor region 34a to the floating diffusion portion (FD) and the charge transfer from the embedded n-type semiconductor region 34b to the surface n-type semiconductor region 34a, to effectively transfer the charges without any transfer remaining, and to control the back flow of the transferred charges.

The thicknesses of the gate insulating films 41a and 41b under the transfer gate electrode 42 extended in a surface of the substrate and under the periphery of the transfer gate electrode 43 buried in the substrate are caused to differ from each other, so that it is possible to generate different electrical fields under both gate insulation films 41a and 41b when the gate voltage is applied. In the example, the thickness of the gate insulating film 41b is made larger than that of the gate insulating film 41a.

The solid-state imaging device 31 of the first embodiment mentioned above can be applied to a backside illumination type solid-state imaging device, or a surface illumination type solid-state imaging device. In the backside illumination type solid-state imaging device, the interconnection layer in which the multilayered interconnections are disposed is formed on the surface in which the pixel transistor of the semiconductor substrate 32 is formed with the interlayer insulating film interposed therebetween, and a support substrate is attached to the interconnection layer. The backside of the semiconductor substrate 32 is polished using chemical mechanical polishing (CMP), wet etching and the like, and the semiconductor substrate 32 is thinned so that the photodiode PD comes close to the substrate backside. A p-type semiconductor region for suppression of the dark current is formed at the backside of the thinned semiconductor substrate 32, and a color filter and an on-chip lens are formed through an antireflection film and the like, whereby the backside illumination type solid-state imaging device is formed.

In the surface illumination type solid-state imaging device, the interconnection layer in which the multilayered interconnections are disposed is formed on the surface in which the pixel transistor of the semiconductor substrate 32 is formed with the interlayer insulating film interposed therebetween. The interconnections are formed except for the upper portion of the photodiode PD. The color filter and the on-chip lens are formed on this interconnection layer with a planarization film interposed therebetween, whereby the surface illumination type solid-state imaging device is formed.

Example 1 of Method of Manufacturing Solid-State Imaging Device

Figure 11A:
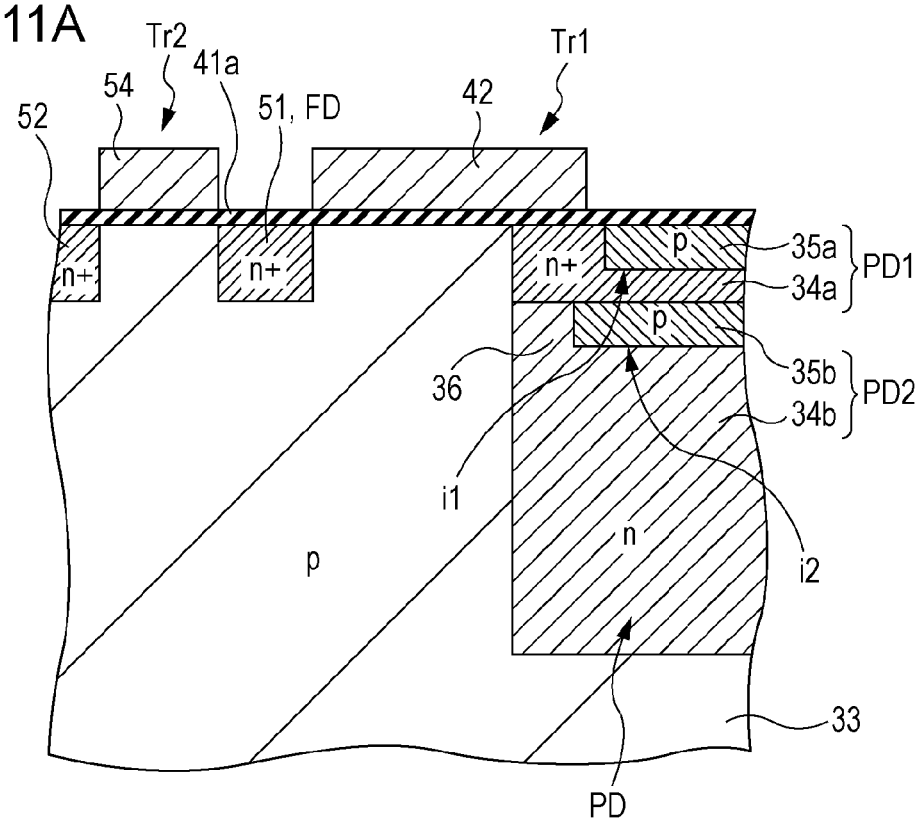
FIG. 11A to 11B are manufacturing process diagrams (part 1) illustrating the first example of a method of manufacturing the solid-state imaging device according to the invention.

FIGS. 11A and 11B and FIGS. 12A and 12B show an example of the method of manufacturing the solid-state imaging device 31 according to the first embodiment. First, as shown in FIG. 11A, the separation region 37 (not shown) and the photodiode PD (D1, PD2) are formed in the p-type semiconductor well region 33 of the semiconductor substrate. In addition, the other pixel transistors are formed by the plane transistor which includes the floating diffusion portion (FD) and has a plane gate electrode in the pixel transistor. In this case, in the transfer transistor Tr1, the plane transfer transistor is also formed simultaneously with other pixel transistors except for the vertical transistor described later. In this plane transfer transistor, the transfer gate electrode 42 extended in a surface of the substrate is formed on the surface of the p-type semiconductor well region 33 with the gate insulating film 41a interposed therebetween. The transfer gate electrode 42 extended in a surface of the substrate is formed of the same electrode material as that of other plane gate electrodes, and is simultaneously formed by patterning of other plane gate electrodes. The electrode material is formed by, for example, an impurity-doped polysilicon film. Other pixel transistors are the reset transistor Tr2, the amplification transistor Tr3, and the selection transistor Tr4. In addition, the CMOS transistor is formed in the region, in which the peripheral circuit of the semiconductor substrate is formed, by the plane transistor included in the peripheral circuit.

Figure 11B:
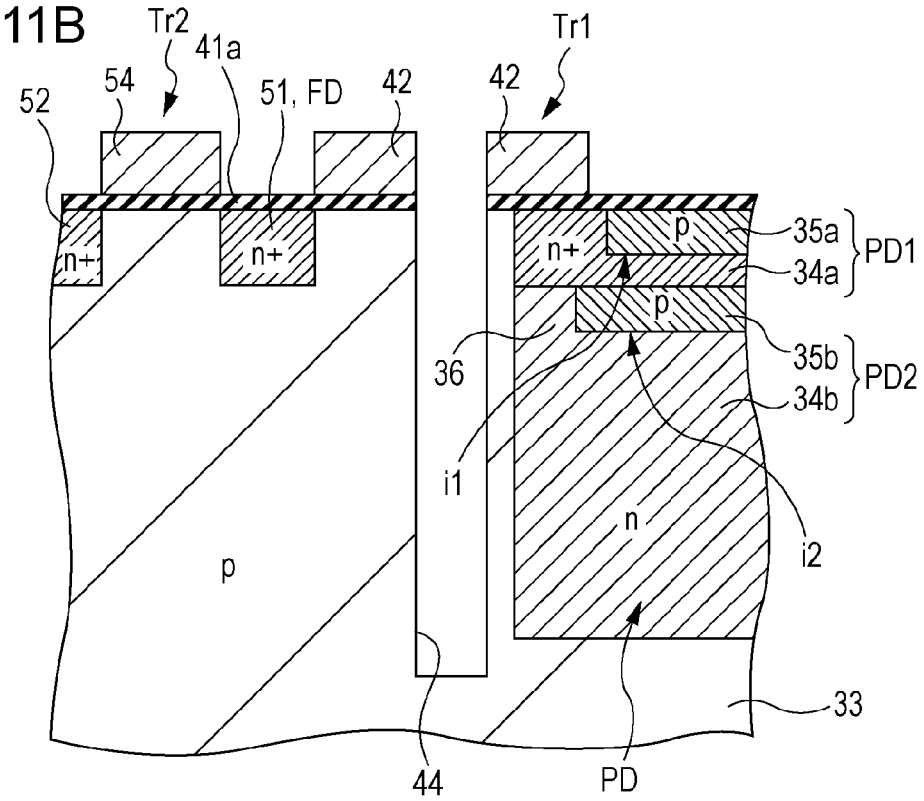

Next, as shown in FIG. 11B, the vertical hole (concave hole) 44 in the vertical direction is formed in the inside of the semiconductor substrate through the transfer gate electrode 42 extended in a surface of the substrate by dry etching.

Figure 12A:
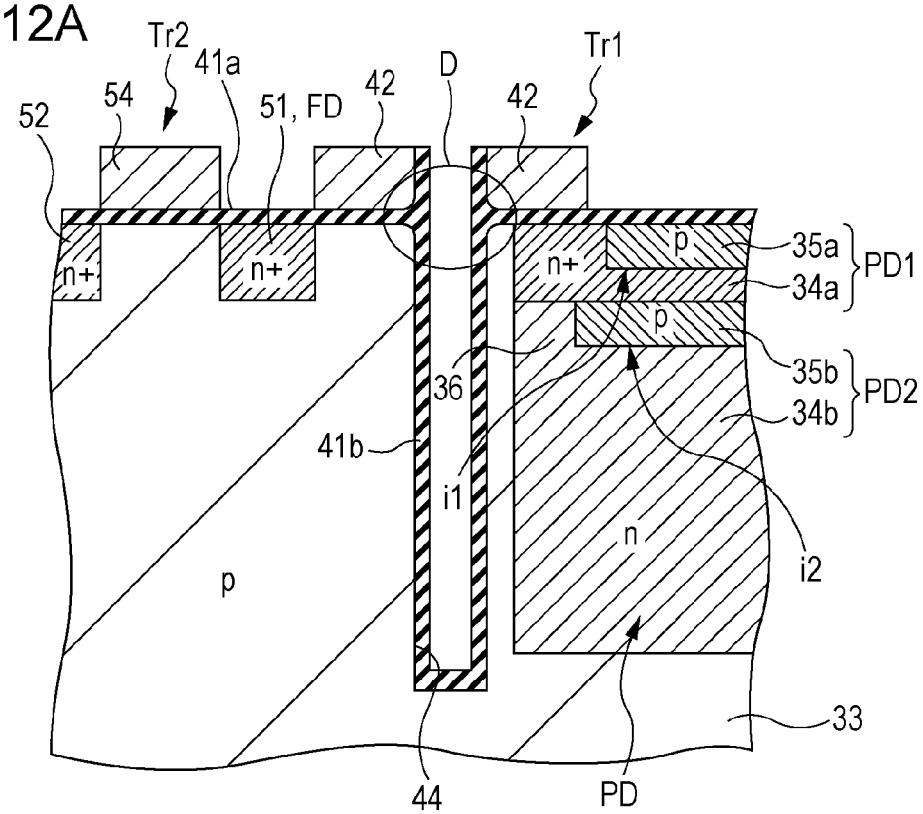
FIG. 12A to 12B are manufacturing process diagrams (part 2) illustrating the first example of the method of manufacturing the solid-state imaging device according to the invention.
Figure 12B:
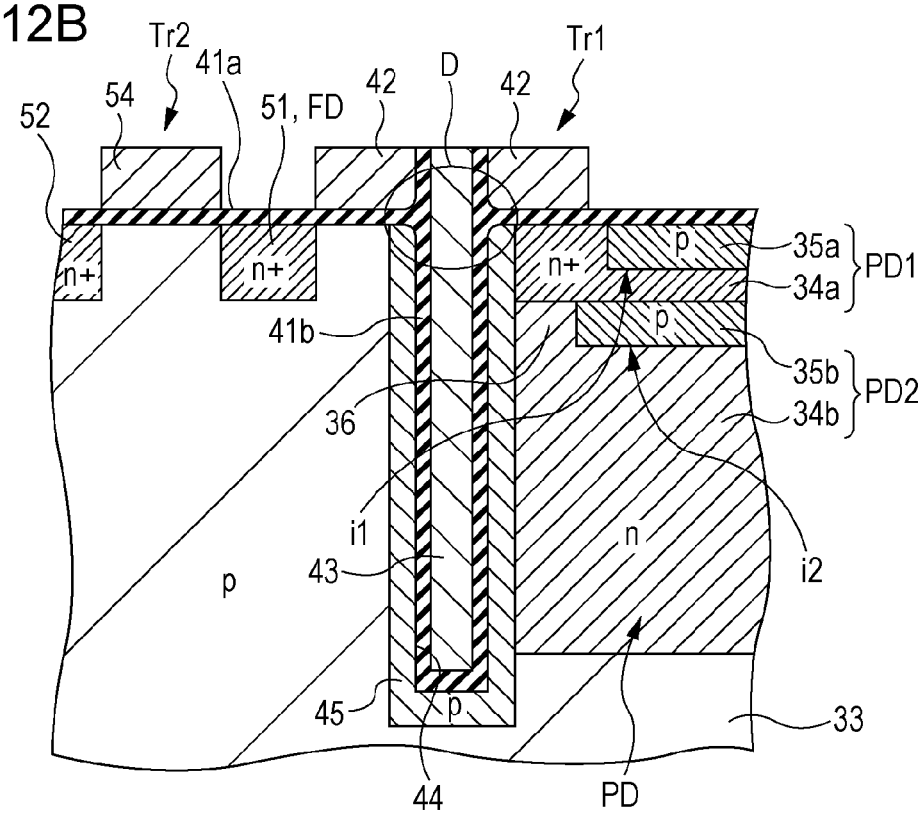

Next, as shown in FIG. 12B, the gate insulating film 41b is formed in the inner wall surface of the vertical hole 44. This gate insulating film 41b can be formed by, for example, a thermal oxidation film ($SiO_2$ film). The processing temperature and the processing time in the thermal oxidation process are controlled, and the gate insulating film is controlled in a desired thickness. In this case, thermal oxidation of a portion facing the vertical hole 44 of the gate insulating film 41a under the electrode material layer 42A proceeds, and the corner portions of the electrode material layer 42A and the corner portions of the silicon semiconductor substrate are rounded as shown by the round frame D. The thickness of the gate insulating film 41a in the roundness of the corner portions and its portion becomes larger, so that concentration of the electrical field in the corner portions when used as the transfer gate electrode extended in a surface of the substrate is alleviated. In addition, the gate insulating film 41b can be formed by a high-dielectric constant (High-K) insulation film, through, for other example, a low-temperature atomic layer deposition (ALD) method and the like. When the gate insulating film is formed by the high-dielectric insulation film through the low-temperature atomic layer deposition method and the like, there is no case where the transistor characteristics of the peripheral circuit section are varied.

Next, as shown in FIG. 12B, the p-type semiconductor region 45 is formed in the interface between the gate insulating film 41b located at the inner wall surface of the vertical hole 44 and the silicon substrate by implantation of impurity ions from the upper side through the vertical hole 44. Implantation of the impurity ions can be performed several times having different driving energies. Next, the transfer gate electrode 43 buried in the substrate is formed by embedding an electrode material within the vertical hole 44. In the example, the transfer gate electrode 43 buried in the substrate is formed by, for example, embedding impurity-doped polysilicon which is the same material as that of the transfer gate electrode 42 extended in a surface of the substrate.

Alternatively, the transfer gate electrode 43 buried in the substrate can be formed by forming a polysilicon film while performing impurity doping within the vertical hole 44. Alternatively, the transfer gate electrode 43 buried in the substrate can also be formed by a metal film formed through a CVD (chemical vapor deposition) method, a PVA (physical vapor deposition) method and the like.

Thereafter, as normal, the purposeful solid-state imaging device 31 is obtained by forming the interconnection layer, the color filter, and the on-chip lens.

Example 2 of Method of Manufacturing Solid-State Imaging Device

FIGS. 13A and 13B and FIGS. 14A and 14B show an example of the method of manufacturing the solid-state imaging device 31 according to the first embodiment. First, as shown in FIG. 13A, FIGS. 11A and 11B and FIGS. 12A and 12B show an example of the method of manufacturing the solid-state imaging device 31 according to the first embodiment. First, as shown in FIG. 11A, the separation region 37 (not shown) and the photodiode PD (D1, PD2) are formed in the p-type semiconductor well region 33 of the semiconductor substrate. In addition, the other pixel transistors are formed by the plane transistor which includes the floating diffusion portion (FD) and has a plane gate electrode in the pixel transistor. In this case, in the transfer transistor Tr1, the plane transfer transistor is also formed simultaneously with other pixel transistors except for the vertical transistor described later. In this plane transfer transistor, the transfer gate electrode 42 extended in a surface of the substrate is formed on the surface of the p-type semiconductor well region 33 with the gate insulating film 41a interposed therebetween. The transfer gate electrode 42 extended in a surface of the substrate is formed of the same electrode material as that of other plane gate electrodes, and is simultaneously formed by patterning of other plane gate electrodes. The electrode material is formed by, for example, an impurity-doped polysilicon film. Other pixel transistors are the reset transistor Tr2, the amplification transistor Tr3, and the selection transistor Tr4. In addition, the CMOS transistor is formed in the region, in which the peripheral circuit of the semiconductor substrate is formed, by the plane transistor included in the peripheral circuit.

Next, the vertical hole 44 in the vertical direction is formed in the inside of the semiconductor substrate through the transfer gate electrode 42 extended in a surface of the substrate by dry etching.

Figure 13A:
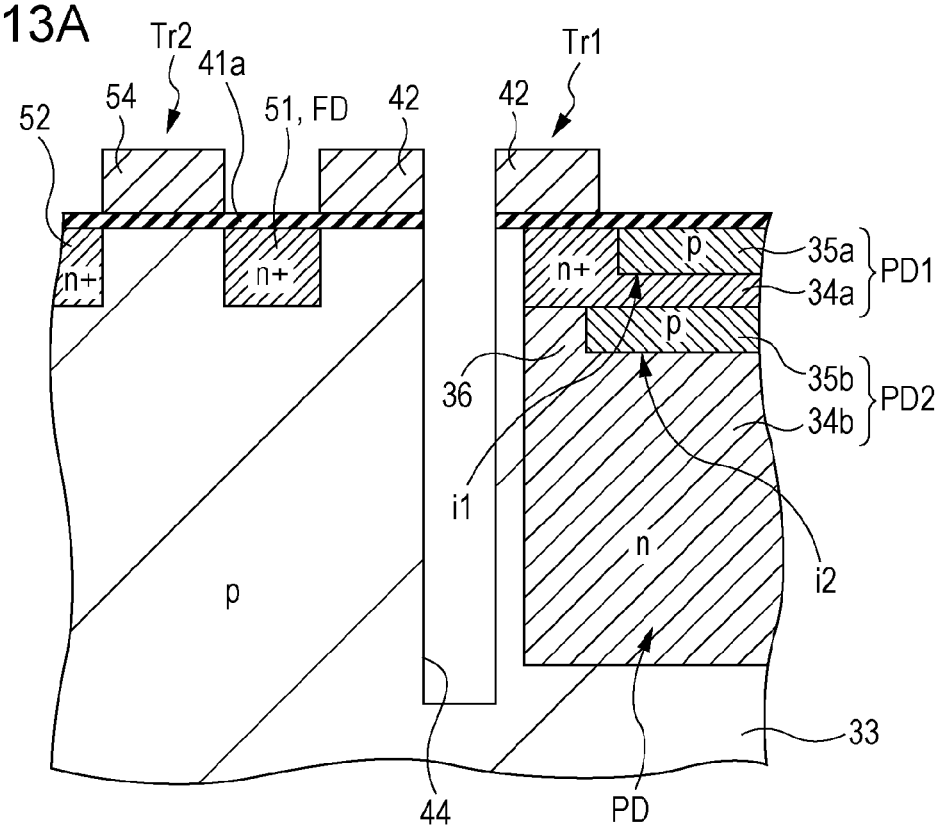
FIG. 13A to 13B are manufacturing process diagrams (part 1) illustrating the second example of the method of manufacturing the solid-state imaging device according to the invention.
Figure 13B:
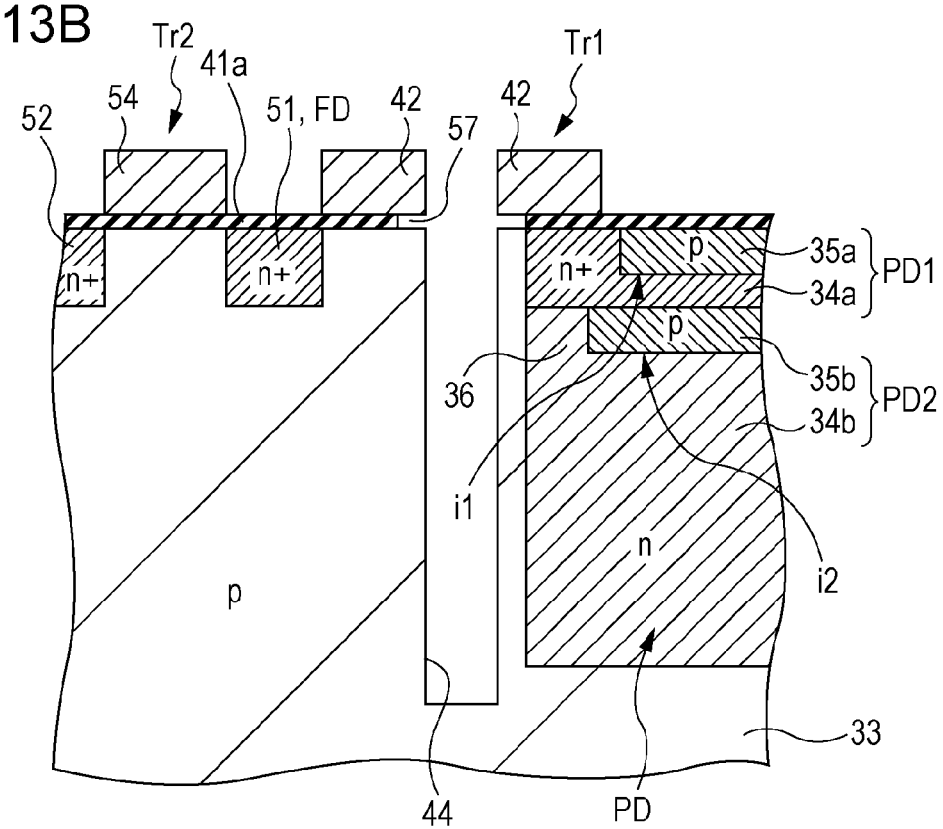

Next, as shown in FIG. 13B, a portion facing the vertical hole 44 of the gate insulating film 41a under the transfer gate electrode 42 extended in a surface of the substrate is removed by dry etching, to form a void 57.

Figure 14A:
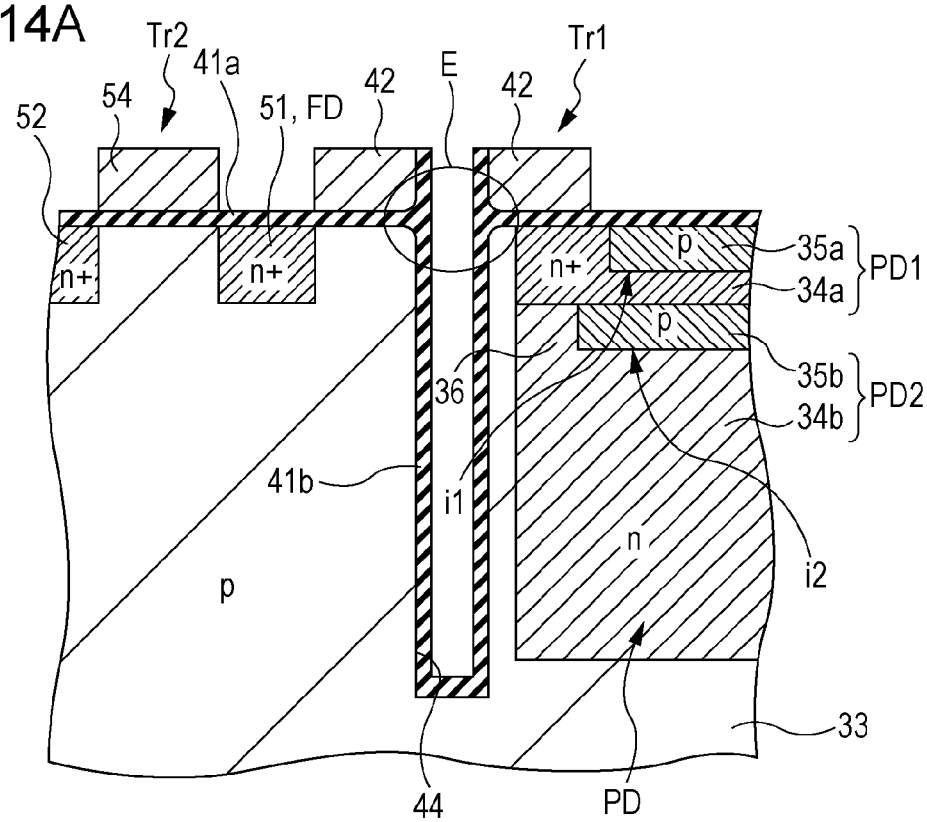
FIG. 14A to 14B are manufacturing process diagrams (part 2) illustrating the second example of the method of manufacturing the solid-state imaging device according to the invention.

Next, as shown in FIG. 14A, the gate insulating film 41b is formed in the inner wall surface of the vertical hole 44. This gate insulating film 41b can be formed by, for example, a thermal oxidation film ($SiO_2$ film). The processing temperature and the processing time of thermal oxidation in the thermal oxidation process are controlled, and the gate insulating film is controlled in a desired thickness. In this case, thermal oxidation within the void 57 proceeds, and thus as shown by the round frame E, the corner portions of the electrode material layer 42A and the corner portions of the silicon semiconductor substrate are more reliably rounded, and the thickness of the gate insulating film 41a in the portion thereof becomes larger. The roundness of the corner portions and the thickness of the gate insulating film 41a in those portions become larger, so that concentration of the electrical field in the corner portions when used as the transfer gate electrode extended in a surface of the substrate is further alleviated. In addition, the gate insulating film 41b can also be formed by a high-dielectric constant (High-K) insulation film, through, for other example, a low-temperature atomic layer deposition (ALD) method and the like. When the gate insulating film is formed by the high-dielectric insulation film through the low-temperature atomic layer deposition method and the like, there is no case where the transistor characteristics of the peripheral circuit section are varied.

The High-K insulation film capable of being formed by the low-temperature atomic layer deposition method includes, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film and the like. In addition, materials other than the above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$) and the like. Further, the above-mentioned materials include samarium oxide ($Sm_2O_3$), europium oxide ($Eu_2O_3$), gadolinium oxide (($Gd_2O_3$), terbium oxide ($Tb_2O_3$), dysprosium oxide ($Dy_2O_3$) and the like. Further, the above-mentioned materials include holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$) and the like. In addition, materials in which nitrogen, carbon, silicon and the like are mixed with the above-mentioned materials can also be used.

Figure 14B:
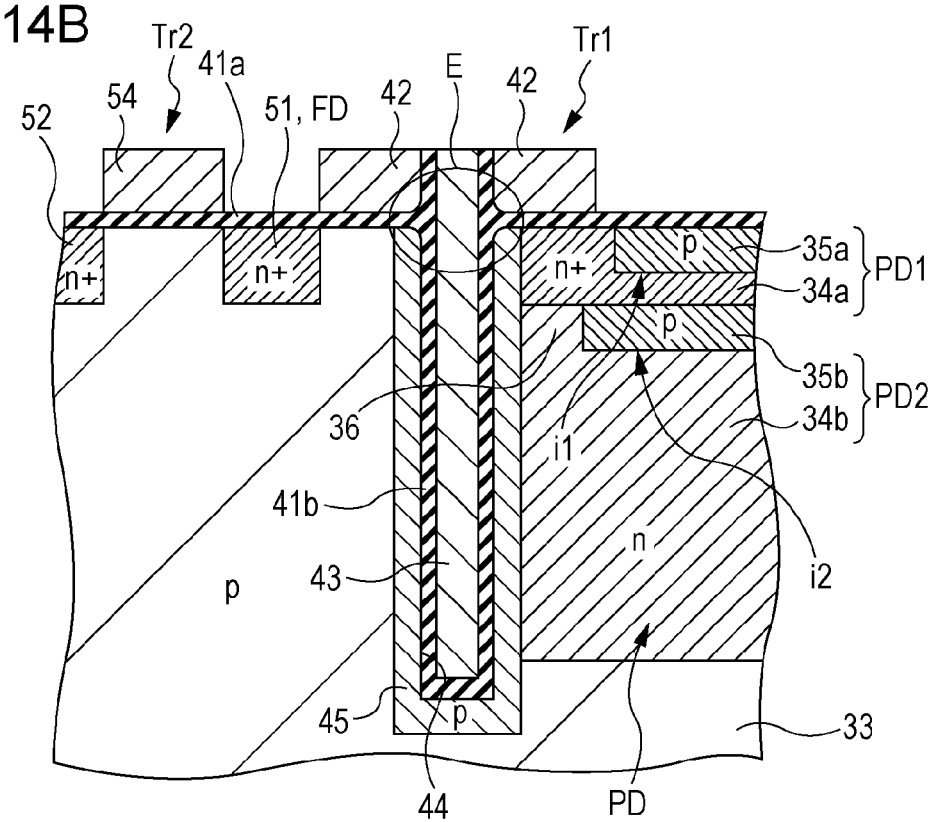

Next, as shown in FIG. 14B, the p-type semiconductor region 45 is formed in the interface between the gate insulating film 41b located at the inner wall surface of the vertical hole 44 and the silicon substrate by implantation of impurity ions from the upper side through the vertical hole 44. Implantation of the impurity ions can be performed as several times of ion implantation having different driving energy. Next, the transfer gate electrode 43 buried in the substrate is formed by embedding an electrode material within the vertical hole 44. In the example, the transfer gate electrode 43 buried in the substrate is formed by, for example, embedding impurity-doped polysilicon which is the same material as that of the transfer gate electrode 42 extended in a surface of the substrate. This transfer gate electrode 43 buried in the substrate can be formed by performing impurity doping through ion implantation, for example, after a non-doped polysilicon film is formed within the vertical hole 44.

Alternatively, the transfer gate electrode 43 buried in the substrate can be formed by forming a polysilicon film while performing impurity doping within the vertical hole 44. Alternatively, the transfer gate electrode 43 buried in the substrate can also be formed by a metal film formed through a CVD (chemical vapor deposition) method, a PVA (physical vapor deposition) method and the like.

Metals used in semiconductors in general such as Ti, TiN, W, Ta, and Mo can be used as the metal film.

After, as normal, the purposeful solid-state imaging device 31 is obtained by forming the interconnection layer, the color filter, and the on-chip lens.

According to examples 1 and 2 of the method of manufacturing the above-mentioned solid-state imaging device, the purposeful solid-state imaging device 31 can be manufactured with a good degree of accuracy. In examples 1 and 2 of the manufacturing method, it is possible to achieve a process of adding the vertical transfer transistor without affecting the transistor characteristics of the plane transistor included in the peripheral circuit. That is, after the pixel transistor and the plane transistor of the peripheral circuit are formed, and activation annealing of the source region and the drain region is finished, the transfer gate electrode 43 buried in the substrate is formed by a low-temperature process. Therefore, the vertical transfer transistor can be formed, particularly, without affecting the CMOS transistor characteristics of the peripheral circuit. Since the gate insulating films of the plane transistor and the vertical transistor are formed by different processes, and are formed with the respective optimal film thicknesses, the characteristics of the plane transistor are not varied, and thus circuits of the related art can be used as they are.

3. Second Embodiment

Configuration Example of Solid-State Imaging Device

The solid-state imaging device according a second embodiment of the invention is configured, although not shown, such that the electrode materials of the transfer gate electrode 42 extended in a surface of the substrate and the transfer gate electrode 43 buried in the substrate are formed by materials having different work functions in the configuration according to the first embodiment of FIG. 3. When the work function of the transfer gate electrode 43 buried in the substrate is made small, pinning is strengthened.

For example, the transfer gate electrode 42 extended in a surface of the substrate can be formed by an impurity doping polysilicon film, and the transfer gate electrode 43 buried in the substrate can be formed by a metal film, for example, an Al film and the like.

Other configurations are the same as those described in the first embodiment, and thus detailed description will not be repeated.

According to the solid-state imaging device of the second embodiment, the transfer gate electrode 42 extended in a surface of the substrate and the transfer gate electrode 43 buried in the substrate are formed by the electrode materials having different work functions, so that it is possible to generate different electrical fields in the silicon substrate adjacent to each of the electrodes 42 and 43. That is, when the same potential or a different potential is applied to both electrodes 42 and 43, it is possible to cause surface potentials of the silicon substrate adjacent to each of the electrodes 42 and 43 to differ from each other with the gate insulating films 41a and 41b interposed therebetween. For example, even the same potential is applied to both electrodes 42 and 43, it is possible to strengthen the hole pinning under the periphery of the transfer gate electrode 43 buried in the substrate further than the hole pinning under the transfer gate electrode 42 extended in a surface of the substrate. The electrode materials of the transfer gate electrode 43 buried in the substrate can be freely selected, and materials having appropriate work functions are selected, so that the same effect that a negative bias voltage is applied is obtained.

Furthermore, the same effects as those described in the first embodiment are exhibited.

4. Third Embodiment

The solid-state imaging device according to a third embodiment of the invention is configured, although not shown, such that materials of the gate insulating film 41a under the transfer gate electrode 42 extended in a surface of the substrate and the gate insulating film 41b under the periphery of the transfer gate electrode 43 buried in the substrate are caused to differ from each other in the configuration according to the first embodiment in FIG. 3. In the embodiment, particularly the gate insulating film 41b under the periphery of the transfer gate electrode 43 buried in the substrate is formed to have a material film with a negative fixed charge. The gate insulating film 41b can be formed by a material film having negative fixed charges. In addition, the gate insulating film 41b can be formed by a laminated film of a material film having negative fixed charges and a normal insulation film, for example, a silicon oxide film. In this case, the material film having negative fixed charges is preferably formed in a lower layer. The gate insulating film 41a under the transfer gate electrode 42 extended in a surface of the substrate is formed by a normal insulation film, for example, a silicon oxide film and the like.

The material film having negative fixed charges is formed by, for example, a hafnium oxide ($HfO_2$) film, an aluminum oxide ($Al_2O_3$) film, a zirconium oxide ($ZrO_2$) film, a tantalum oxide ($Ta_2O_5$) film, or a titanium oxide ($TiO_2$) film. A film formation method includes, for example, a chemical vapor deposition method, a sputtering method, an atomic layer deposition method and the like. When the atomic layer deposition method is used, it is preferable to simultaneously form a $SiO_2$ film of 1 nm or so used in reducing the interface state during film formation. In addition, materials other than the above include lanthanum oxide ($La_2O_3$), praseodymium oxide ($Pr_2O_3$), cerium oxide ($CeO_2$), neodymium oxide ($Nd_2O_3$), promethium oxide ($Pm_2O_3$) and the like. Further, the above-mentioned materials include samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$) and the like. Further, the above-mentioned materials include holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$) and the like. Further, the above-mentioned film having negative fixed charges can also be formed by a hafnium nitride film, an aluminum nitride film, a hafnium oxynitride film or an aluminum oxynitride film.

The above-mentioned film having negative fixed charges may be added with silicon (Si) or nitrogen (N) into the film in the range without damaging insulation properties. The concentration thereof is appropriately determined in the range without damaging insulation properties of the film. In this manner, silicon (Si) or nitrogen (N) is added, so that it is possible to increase heat resistance of the film or blocking capability of ion implantation in the process.

According to the solid-state imaging device of the third embodiment, the materials of the gate insulating film 41a under the transfer gate electrode 42 extended in a surface of the substrate are caused to differ from each other, so that it is possible to generate different electrical fields in the silicon substrate adjacent to each of the electrodes 42 and 43. That is, when the same potential or a different potential is applied to both electrodes 42 and 43, it is possible to cause the surface potentials of the silicon substrate adjacent to each of the electrodes 42 and 43 to differ from each other with the gate insulating films 41a and 41b interposed therebetween.

Particularly, the material of the gate insulating film 41b under the periphery of the transfer gate electrode 43 buried in the substrate is freely selected. Thereby, the gate insulating film 41b is formed to have the material film with negative fixed charges, so that the same effect that the negative bias voltage is applied is obtained, for example, at the time of the charge accumulation. The negative bias voltage applied to the transfer gate electrode 43 buried in the substrate can be reduced in absolute value.

Furthermore, the same effects as those described in the first embodiment are exhibited.

5. Fourth Embodiment

Configuration Example of Solid-State Imaging Device

Figure 16:
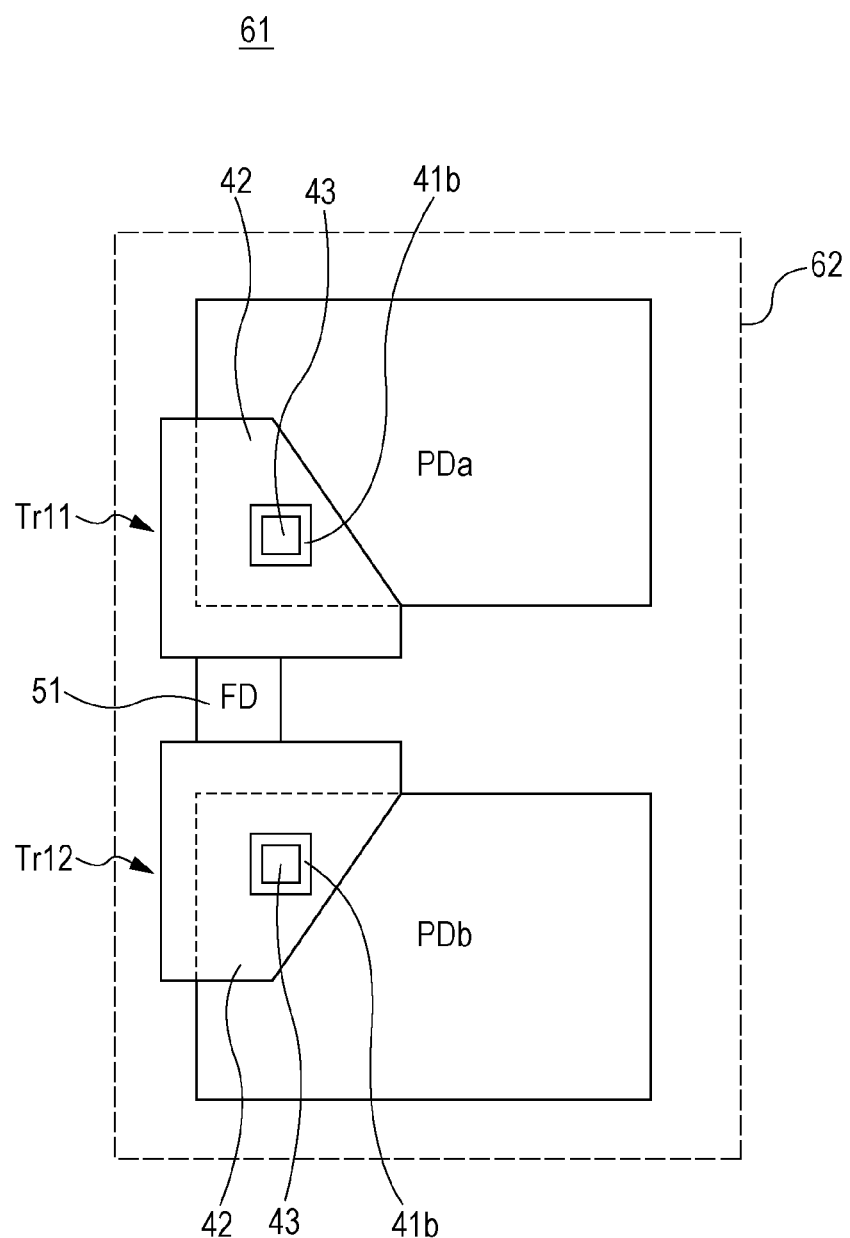
FIG. 16 is a schematic plan view of the main part illustrating the fourth embodiment of the solid-state imaging device according to the invention.

FIG. 15 and FIG. 16 show a fourth embodiment of the solid-state imaging device according to the invention. The embodiment is a case applied to the two-pixel shared CMOS solid-state imaging device. FIG. 15 is a schematic plan view of a main part of the two-pixel shared unit pixel group of the pixel region, and FIG. 16 is a schematic plan view illustrating the portions of the photodiode which is a photoelectric conversion section and the transfer transistor.

In a solid-state imaging device 61 according to the fourth embodiment, a plurality of so-called two-pixel shared unit pixel groups 62, in which one pixel transistor portion is shared in two photodiodes PDa and PDb, is two-dimensionally arranged and the pixel region is formed. For details, the unit pixel group 62 includes two photodiodes PDa and PDb, two transfer transistors Tr11 and Tr12, one reset transistor Tr2, an amplification transistor Tr3, and a selection transistor Tr4. Two photodiodes PDa and PDb are disposed with an n-type semiconductor region 51 serving as a floating diffusion portion (FD) interposed therebetween. The configurations of each of the photodiodes PDa and PDb are the same as those shown in FIG. 3. In addition, the configurations of each of the transfer transistors Tr11 and Tr12 have the transfer gate electrode 42 extended in a surface of the substrate and the transfer gate electrode 43 buried in the substrate, similarly to those shown in FIG. 3. Other configurations are the same as those of the first embodiment described with reference to FIG. 3, and thus description thereof will not be repeated. In the embodiment, the configurations of the second and third embodiments can also be combined.

Even in the solid-state imaging device 61 according to the fourth embodiment, the same effects as those described in the first embodiment are exhibited. In addition, the same effects as the second and third embodiments are exhibited by combination of the configurations of the second and third embodiments.

The above-mentioned fourth embodiment is applied to the two-pixel shared solid-state imaging device, but can also be applied to a plural-pixel shared solid-state imaging device, such as a column 2×row 2 pixel type four-pixel solid-state imaging device, besides that.

6. Fifth Embodiment

Configuration Example of Solid-State Imaging Device

Figure 17:
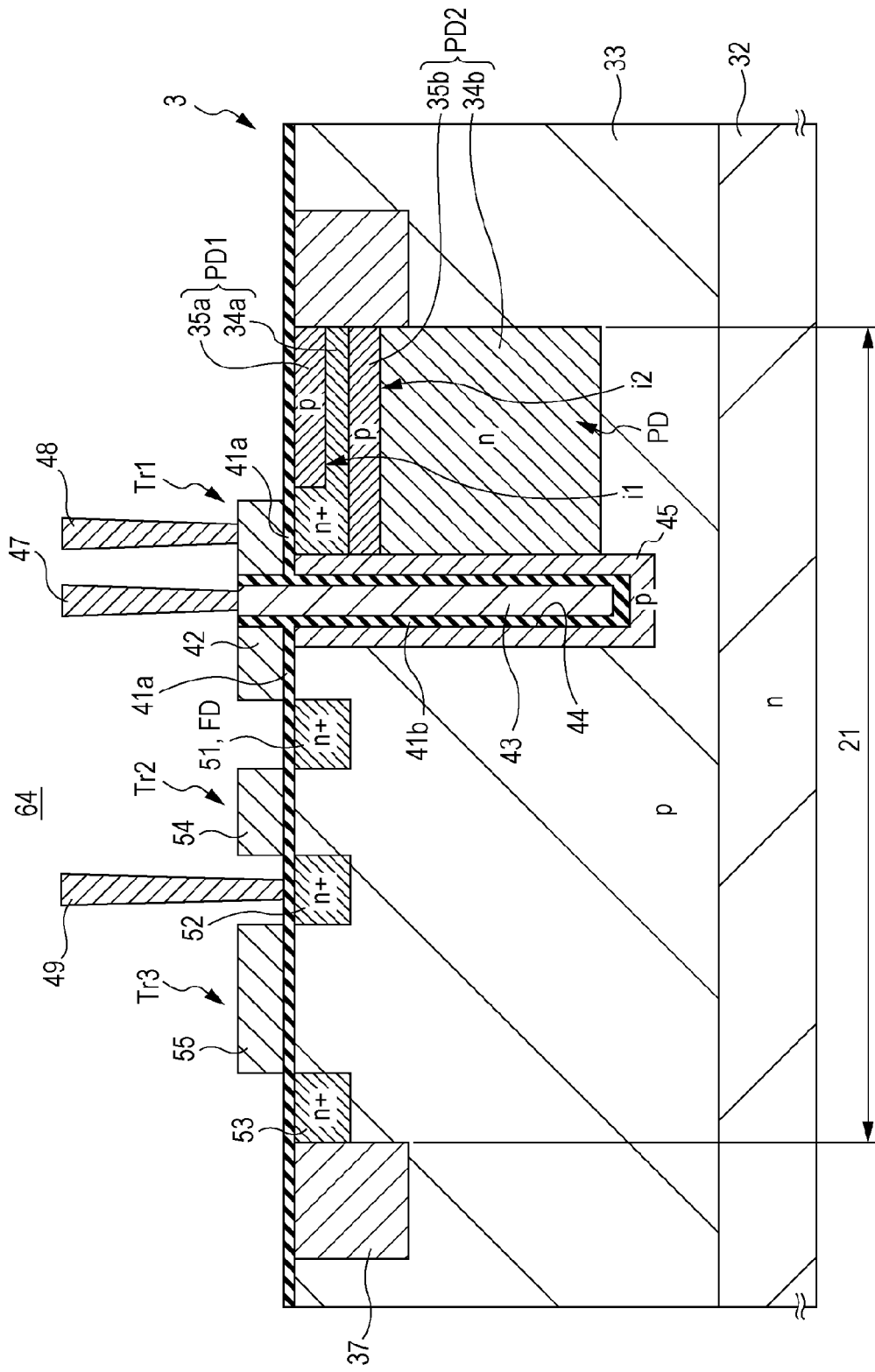
FIG. 17 is a schematic cross-sectional view of a main part illustrating a fifth embodiment of the solid-state imaging device according to the invention.

FIG. 17 shows a fifth embodiment of the solid-state imaging device according to the invention. The embodiment is a case applied to the CMOS solid-state imaging device in which the unit pixel 21 is arranged. FIG. 17 is a schematic cross-sectional view of the main part of the pixel region 3. A solid-state imaging device 64 according to the fifth embodiment is configured such that in the solid-state imaging device of the first embodiment of FIG. 3, the p-type semiconductor region 35b of the second photodiode PD2 is formed so as to come into contact with the p-type semiconductor region 45 in the longitudinal direction for suppressing the dark current. That is, in the embodiment, the n-type narrow portion 36 is not formed. In this configuration, since the amount of saturated charges Qs of each of the upper and lower photodiodes PD1 and PD2 is small, overflow is easily made. Insofar as the overflow destinations are all the upper and lower photodiodes PD, there is no problem. However, when overflow leaks into the immersed pixel, color mixture occurs. Consequently, it is necessary for the barrier of the p-type semiconductor region 35b to be set to have a lower concentration than the separation between pixels.

Since other configurations are the same as those described in the first embodiment, the same reference numerals are assigned to the same elements corresponding to FIG. 3, and description thereof will not be repeated.

According to the solid-state imaging device 64 of the fifth embodiment, at the time of the charge accumulation, the movement of the charges between the upper and lower photodiodes PD1 and PD2 does not occur. However, since the charges are accumulated in at least the first and second photodiodes PD1 and PD2, both of miniaturization of the pixel and increase in the amount of saturated charges Qs can be satisfied.

Even in the solid-state imaging device of the fifth embodiment, the application of the voltage to the transfer gate electrode 43 buried in the substrate and the transfer gate electrode 42 extended in a surface of the substrate at the time of the charge accumulation, and the charge transfer at the time of the charge transfer are the same as those described in the first embodiment, and the same effect as that of the first embodiment is exhibited.

Meanwhile, in the solid-state imaging device according to the above-mentioned embodiment, the first conductivity type is set to an n-type and the second conductivity type is set to a p-type, using the signal charge as an electron. However, the solid-state imaging device can also be applied to a solid-state imaging device in which the signal charge is used as a hole. In this case, the p-type becomes the first conductivity type, and the n-type becomes the second conductivity type, by setting the conductivity type of each of the semiconductor substrate, the semiconductor well region or the semiconductor region to be reverse.

7. Sixth Embodiment

Configuration Example of Electronic Apparatus

The solid-state imaging device according to the invention described above can be applied to electronic apparatuses such as, for example, camera systems of a digital camera or a video camera and the like, cellular phones having an imaging function, or other apparatuses having an imaging function.

Figure 18:
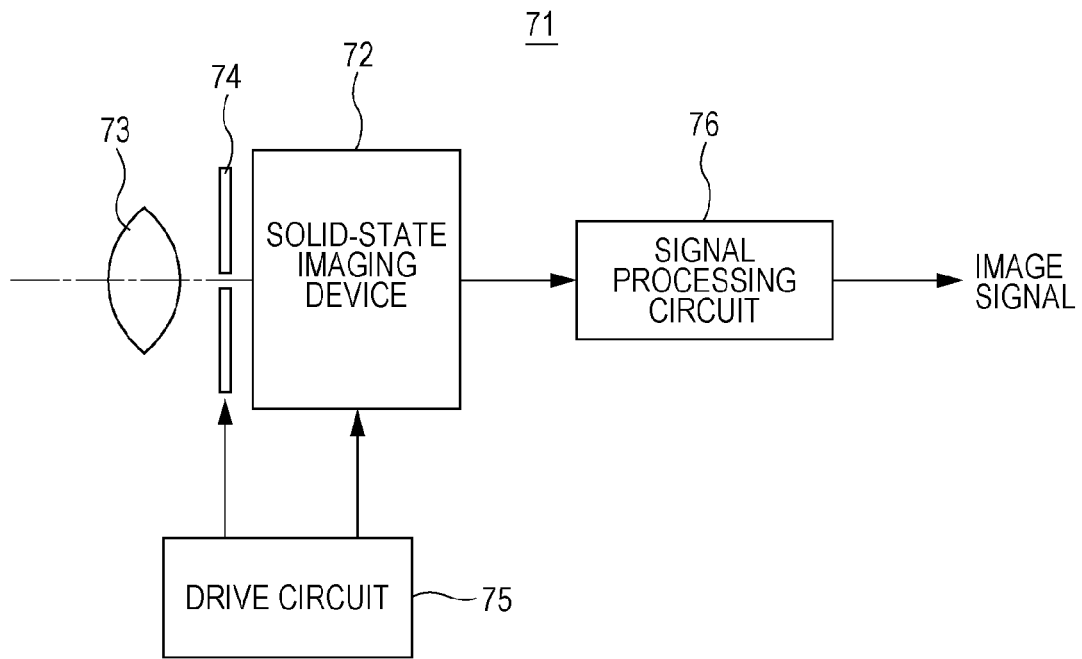
FIG. 18 is a schematic diagram of an electronic apparatus according to a sixth embodiment of the invention.

FIG. 18 shows a sixth embodiment applied to a camera as an example of the electronic apparatus according to the invention. The camera according to the embodiment includes a video camera capable of capturing a still image or a moving image as an example. A camera 71 according to the embodiment includes a solid-state imaging device 72, an optical system 73 for leading incident light to a light-receiving sensor portion of the solid-state imaging device 72, and a shutter device 74. Further, the camera 71a drive circuit 75 for driving the solid-state imaging device 72, and a signal processing circuit 76 for processing an output signal of the solid-state imaging device 72.

The solid-state imaging device 72 is applied to any of the solid-state imaging devices according to each of the embodiments described above. The optical system (optical lens) 73 images image light (incident light) from a subject on the imaging plane of the solid-state imaging device 72. Thereby, the signal charges are accumulated within the solid-state imaging device 72 for a certain period of time. The optical system 73 may be an optical lens system including a plurality of optical lenses. The shutter device 74 controls a light illumination period and a light shielding period to the solid-state imaging device 72. The drive circuit 75 supplies a drive signal for controlling a transfer operation of the solid-state imaging device 72 and a shutter operation of the shutter device 74. The signal transfer of the solid-state imaging device 72 is performed by the drive signal (timing signal) supplied from the drive circuit 75. The signal processing circuit 76 is performed various types of signal processing. The image signal performed by the signal processing is stored in a storage medium such as a memory, or is output to a monitor.

According to the electronic apparatus such as the camera of the sixth embodiment, in the solid-state imaging device 72, even when the pixel size is reduced, the amount of saturated charges per unit area increases, and furthermore, the effect described in the embodiment of the above-mentioned solid-state imaging device is exhibited. Therefore, miniaturization, increase in pixel count, high dynamic range, high sensitivity, and high quality are achieved, and thus the electronic apparatus having high reliability can be provided.

8. Seventh Embodiment

Configuration Example of Three-Dimensional Transistor

Figure 19:
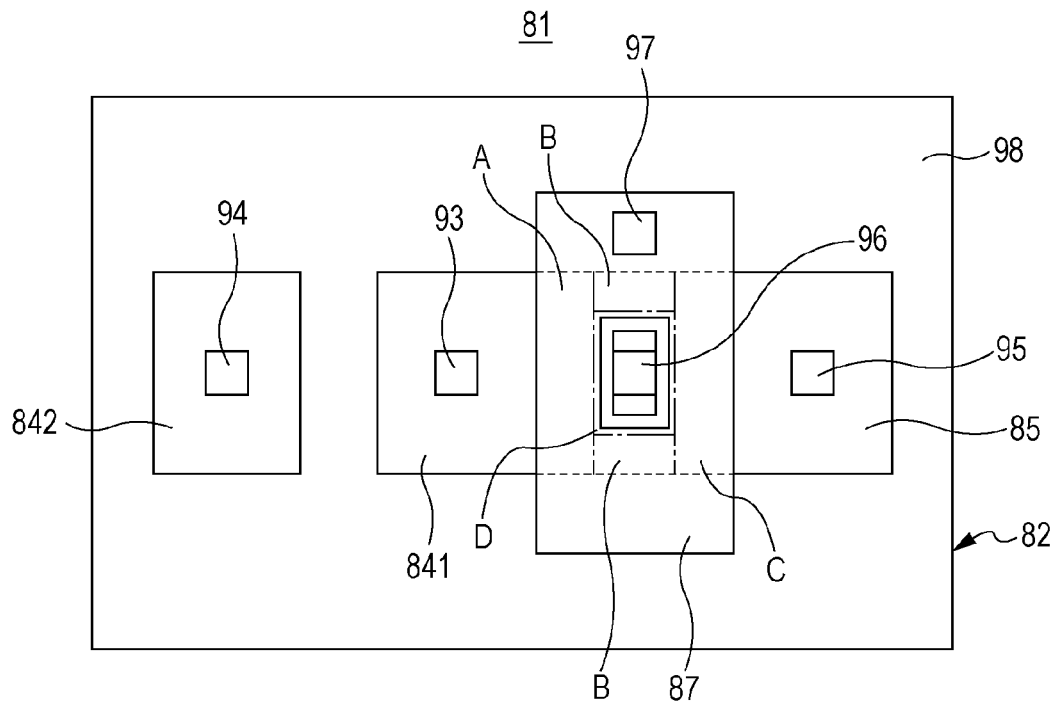
FIG. 19 is a schematic diagram of a three-dimensional transistor according to a seventh embodiment of the invention.
Figure 20:
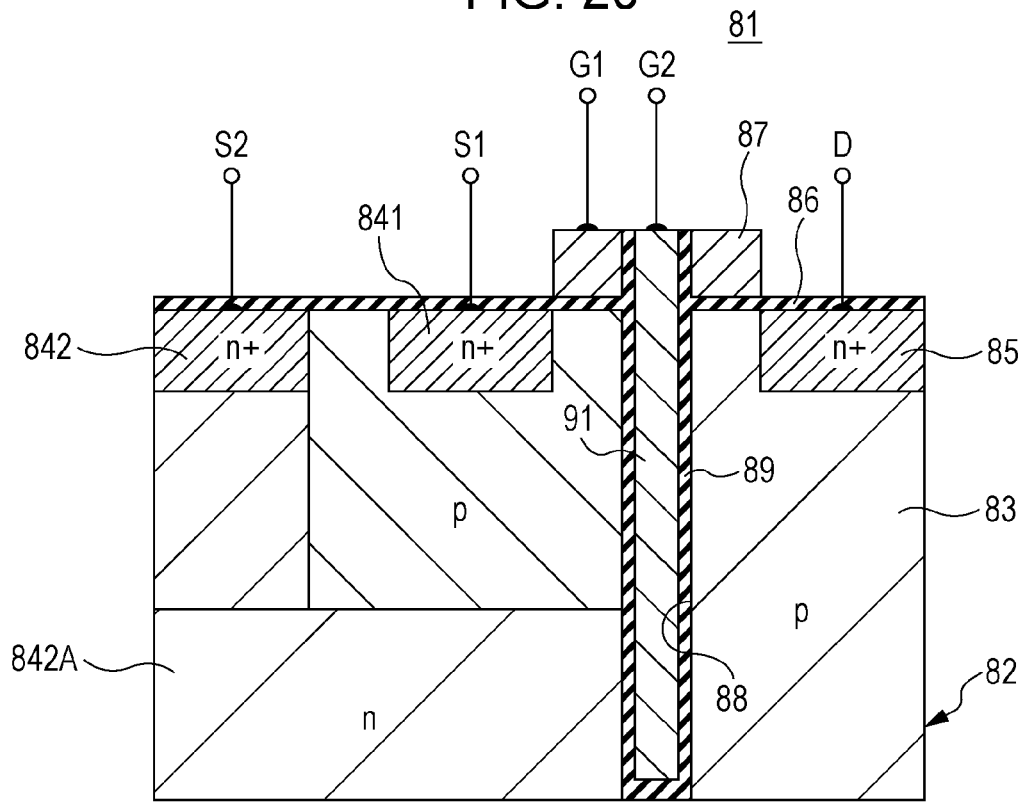
FIG. 20 is a schematic cross-sectional view of FIG. 19.
Figure 21:
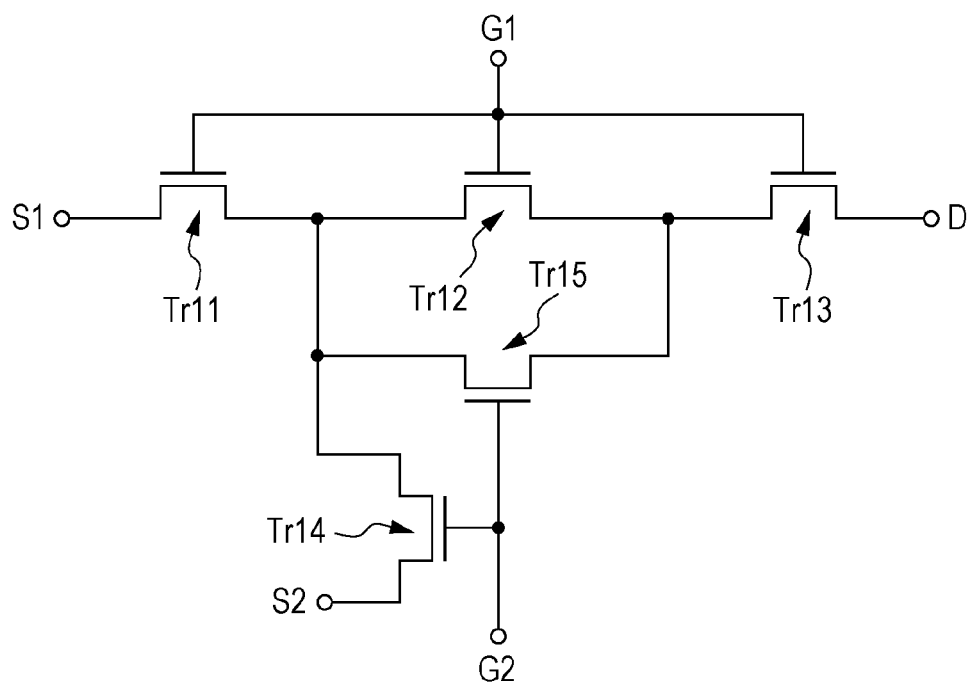
FIG. 21 is an equivalent circuit diagram of the three-dimensional transistor of the invention.

Next, a three-dimensional transistor according to the invention which is applied to the above-mentioned transfer transistor and the like having a three-dimensional structure will be described. FIG. 19 to FIG. 21 show an embodiment of the three-dimensional transistor according to the invention. A three-dimensional transistor 81 according to a seventh embodiment is configured such that a second conductivity type, for example, p-type semiconductor well region 83 is formed in a silicon semiconductor substrate 82, and a source region 84 and a drain region 85 are formed in the surface side of this p-type semiconductor well region 83 through a first conductivity type, that is, n-type semiconductor region. The source region 84 is formed to have a first source region 841 and a second source region 842 in a position away from each other.

A plane gate electrode 87 is formed on the p-type semiconductor well region 83 between the first source region 841 and the drain region 85 with a gate insulating film 86 interposed therebetween. In addition, a vertical hole 88 reaching the inside of the p-type semiconductor well region 83 is formed in the vertical direction passing through the plane gate electrode 87, a gate insulating film 89 is formed in the inner wall surface of the vertical hole 88, and a vertical gate electrode 91 is embedded within the vertical hole 88 with this gate insulating film 89 interposed therebetween. The plane gate electrode 87 and the vertical gate electrode 91 are electrically insulated from each other by the gate insulating film 89 in the periphery of the vertical gate electrode 91.

On the other hand, the second source region 842 has an n-type second source region extension portion 842A extending up to the vertical gate electrode 91 on the inside of the p-type semiconductor well region 83 through the inside of the p-type semiconductor well region 83.

The plane gate electrode 87 and the vertical gate electrode 91 have terminals G1 and G2, respectively, which are drawn out so that independent potentials are applied thereto. The terminals G1 and G2 are respectively connected to independent interconnections. In addition, a terminal D is drawn out from the drain region 85, and terminals S1 and S2 are respectively drawn out from the first source region 841 and the second source region 842. In FIG. 19, regions denoted by reference numerals 93 to 97 show contact regions of each interconnection of the first source region 841, the second source region 842, the drain region 85, the vertical gate electrode 91, and the plane gate electrode 87. Reference numeral 98 shows a separation region, for example, a field insulation layer. Meanwhile, the second source region 842 is not necessarily formed in the semiconductor substrate surface. For example, the p-n junction region inside of the semiconductor substrate may be used as the second source region, or the semiconductor well region may also be used as the second source region.

FIG. 21 shows an equivalent circuit of the three-dimensional transistor 81 according to the seventh embodiment. A first MOS transistor Tr112, a second MOS transistor Tr12, and a third MOS transistor Tr13 are connected in series between the first source terminal S1 and the drain terminal D. The gates of each of the first, second and third transistors Tr11, Tr12 and Tr13 are connected to the common plane gate terminal G1. A fourth MOS transistor Tr14 is connected between the second source terminal S2 and the source end of the second MOS transistor Tr12, and the gate of the fourth MOS transistor Tr14 is connected to the vertical gate terminal G2. Further, a fifth MOS transistor Tr15 is connected in parallel to the second MOS transistor Tr12, and the gate of the fifth MOS transistor TR15 is connected to the vertical gate terminal G2.

In FIG. 19, the channel portion of the plane gate electrode is divided into four regions, and a first region (A) is set to a region from the first source region 841 end of the plane gate electrode 87 to the gate insulating film 89 in the periphery of the vertical gate electrode 91. A third region (C) is set to a region from the drain region 85 end of the plane gate electrode 87 to the gate insulating film 89 in the periphery of the vertical gate electrode 91. A fourth region (D) is set to a channel region generated around the vertical gate electrode. The remaining portion is set to a second region (B).

The first MOS transistor Tr11 is formed in the first region (A).

The second MOS transistor Tr12 is formed in the second region (B).

The third MOS transistor Tr13 is formed in the third region (C).

The fifth MOS transistor Tr15 is formed in the fourth region (D).

The fourth MOS transistor Tr14 is formed in the second source region extension portion 842A, the first source region 841, and the vertical gate electrode 91.

An operation of the three-dimensional transistor 81 according to the seventh embodiment will be described. When the on-voltage is not applied to the plane gate electrode G1, the current does not flow from the second source terminal S2 to the drain terminal D even by the application of the on-voltage to the vertical gate electrode G2. Even when the on-voltage is not applied to the vertical gate electrode G2, the current flows from the first source terminal S1 to the drain terminal D by the application of the on-voltage to the plane gate electrode 87. When the on-voltage is applied to the vertical gate electrode G2, and the on-voltage is applied to the plane gate electrode 87, the channels are formed parallel around the vertical gate electrode 91. Therefore, the effective channel width of the plane transistor increases, and the current value from the first source terminal S1 to the drain terminal D increases.

According to the three-dimensional transistor of the seventh embodiment, it is possible to control the bidirectional currents of the current flowing in a horizontal direction from the first source region to the drain region and the current flowing in the longitudinal direction from the second source region to the drain region.

The present application contains subject matter related to that disclosed in Japanese Priority Patent Application JP 2010-019597 filed in the Japan Patent Office on Jan. 29, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state imaging device comprising:
 a pixel region in which pixels including a photoelectric conversion section and a plurality of pixel transistors are arranged, wherein a transfer transistor of the pixel transistors includes:
a transfer gate electrode extended in a surface of the substrate formed on the surface of a semiconductor substrate; and
a transfer gate electrode buried in the substrate which is electrically insulated from the transfer gate electrode extended in a surface of the substrate and is embedded in the inside of the semiconductor substrate in the vertical direction through the transfer gate electrode extended in a surface of the substrate.

2. The solid-state imaging device according to claim 1, wherein different potentials are independently applied to the transfer gate electrode extended in a surface of the substrate and the transfer gate electrode buried in the substrate.

3. The solid-state imaging device according to claim 2, wherein the potentials are applied at different timings to the transfer gate electrode extended in a surface of the substrate and the transfer gate electrode buried in the substrate.

4. The solid-state imaging device according to claim 3, wherein the transfer gate electrode extended in a surface of the substrate and the transfer gate electrode buried in the substrate are respectively formed by materials having different work functions, and
independent or common potentials are applied to the transfer gate electrode extended in a surface of the substrate and the transfer gate electrode buried in the substrate.

5. The solid-state imaging device according to claim 1, wherein the transfer gate electrode extended in a surface of the substrate and the transfer gate electrode buried in the substrate are respectively formed by materials having different work functions, and
independent or common potentials are applied to the transfer gate electrode extended in a surface of the substrate and the transfer gate electrode buried in the substrate.

6. The solid-state imaging device according to claim 4, wherein a gate insulating film under the transfer gate electrode extended in a surface of the substrate and a gate insulating film under the periphery of the transfer gate electrode buried in the substrate are different from each other in thickness.

7. The solid-state imaging device according to claim 6, wherein the gate insulating film under the transfer gate electrode extended in a surface of the substrate and the gate insulating film under the periphery of the transfer gate electrode buried in the substrate are different from each other in material.

8. The solid-state imaging device according to claim 7, wherein the gate insulating film under the periphery of the transfer gate electrode buried in the substrate is formed to have a material film with negative fixed charges.

9. The solid-state imaging device according to claim 7, wherein the photoelectric conversion section is formed by a multistage photodiode having a p-n junction formed in the vicinity of the surface of the semiconductor substrate, and a p-n junction formed on the inside of the semiconductor substrate.

10. The solid-state imaging device according to claim 8, wherein an interconnection layer is formed in the surface side in which the pixel transistor of the semiconductor substrate is formed, and
incident light is incident from the backside of the semiconductor substrate.

11. A method of manufacturing a solid-state imaging device, comprising the steps of:
forming a photoelectric conversion section, a plane transfer transistor of a transfer transistor, and other pixel transistors in a semiconductor substrate in which pixels of a pixel region are formed;
forming a vertical hole which reaches the inside of the semiconductor substrate in the vertical direction through a transfer gate electrode extended in a surface of the substrate formed in the surface of semiconductor substrate with a gate insulating film interposed therebetween;
forming a gate insulating film on the inner wall surface of the vertical hole; and
forming a transfer transistor having a transfer gate electrode extended in a surface of the substrate and a vertical gate electrode by embedding a transfer gate electrode buried in the substrate within the vertical hole.

12. The method of manufacturing a solid-state imaging device according to claim 11, further comprising the step of:
removing a portion of the gate insulating film facing the inside of the vertical hole by dry etching, after the step of forming the vertical hole.

13. The method of manufacturing a solid-state imaging device according to claim 12, further comprising the steps of:
forming the gate insulating film of the inner wall surface of the vertical hole by an insulation film formed through thermal oxidation, or a high-dielectric insulation film formed through a low-temperature atomic layer deposition method; and
forming the transfer gate electrode buried in the substrate which is embedded within the vertical hole by a conductive polysilicon film, in which polysilicon is formed while performing impurity doping, or a metal film.

14. An electronic apparatus comprising:
an optical lens;
a solid-state imaging device; and
a signal processing circuit that processes an output signal of the solid-state imaging device,
wherein the solid-state imaging device includes:
a pixel region in which pixels including a photoelectric conversion section and a plurality of pixel transistors are arranged, and
a transfer transistor of the pixel transistors includes:
a transfer gate electrode extended in a surface of the substrate formed in the surface of the semiconductor substrate; and
a transfer gate electrode buried in the substrate which is electrically insulated from the transfer gate electrode extended in a surface of the substrate and is embedded in the inside of the semiconductor substrate in the vertical direction through the transfer gate electrode extended in a surface of the substrate.

15. The electronic apparatus according to claim 14, wherein different potentials are independently applied to the transfer gate electrode extended in a surface of the substrate and the transfer gate electrode buried in the substrate.

16. A three-dimensional MOS transistor comprising:
a first source region, a second source region and a drain region formed in a semiconductor substrate;
a plane gate electrode formed on the semiconductor substrate with a gate insulating film interposed between the first source region and the drain region;
a vertical gate electrode which passes through the plane gate electrode and is embedded in the inside of the semiconductor substrate in the vertical direction with a gate insulating film interposed therebetween; and
a second source region extension portion extending from the second source region to the vertical gate electrode.

* * * * *